(12) United States Patent
Bae et al.

(10) Patent No.: US 9,864,448 B2
(45) Date of Patent: Jan. 9, 2018

(54) DISPLAY APPARATUS CAPABLE OF IMAGE SCANNING AND DRIVING METHOD THEREOF

(71) Applicant: Crucialtec Co., Ltd., Asan-si (KR)

(72) Inventors: Byung Seong Bae, Suwon-si (KR); Ho Sik Jeon, Asan-si (KR); Woo Young Choi, Seoul (KR); Jong Uk Kim, Hwaseong-si (KR); Jun Suk Lee, Seongnam-si (KR); So Hyun Jeong, Asan-si (KR); Ju An Yoon, Cheonan-si (KR); Sang A Oh, Seoul (KR)

(73) Assignee: Crucialtec Co., Ltd., Asan-si (KR)

( * ) Notice: Subject to any disclaimer, the term of this patent is extended or adjusted under 35 U.S.C. 154(b) by 0 days.

(21) Appl. No.: 15/589,010

(22) Filed: May 8, 2017

(65) Prior Publication Data

US 2017/0242516 A1 Aug. 24, 2017

Related U.S. Application Data

(63) Continuation of application No. 14/938,316, filed on Nov. 11, 2015, now Pat. No. 9,679,182.

(30) Foreign Application Priority Data

Nov. 12, 2014 (KR) ......................... 10-2014-0156873
Dec. 26, 2014 (KR) ......................... 10-2014-0190692
Mar. 30, 2015 (KR) ......................... 10-2015-0044067

(51) Int. Cl.
*G06F 3/041* (2006.01)
*G06F 3/044* (2006.01)
(Continued)

(52) U.S. Cl.
CPC ............ *G06F 3/0412* (2013.01); *G06F 3/044* (2013.01); *G06F 3/0416* (2013.01);
(Continued)

(58) Field of Classification Search
CPC .... G06F 3/0416; G06F 3/0412; G06F 3/0421; G06F 3/044; G06K 9/00013
See application file for complete search history.

(56) References Cited

U.S. PATENT DOCUMENTS

2011/0025635 A1 2/2011 Lee
2011/0122087 A1 5/2011 Jang et al.
(Continued)

FOREIGN PATENT DOCUMENTS

JP 2010-198309 9/2010
KR 10-2004-0090154 10/2004
(Continued)

OTHER PUBLICATIONS

Non-Final Office Action dated Jan. 27, 2017, in U.S. Appl. No. 14/938,316.
(Continued)

*Primary Examiner* — Lixi C Simpson
(74) *Attorney, Agent, or Firm* — H.C. Park & Associates, PLC

(57) ABSTRACT

A display apparatus capable of image scanning is provided including a contact sensor arranged in each unit pixel. The contact sensor includes a pixel electrode forming a contact capacitance by contact with a contact means; a reset transistor where a drain electrode is connected to a node where the contact capacitance is formed, and each of a gate electrode and a source electrode is connected to a first scan line to which a selective signal is applied; an amplifying transistor where a gate electrode is connected to the drain electrode of the reset transistor; and a detecting transistor where a drain electrode is connected to the drain electrode of the amplifying transistor, a gate electrode is connected to a second scan line to which a selective signal is applied, and a source electrode is connected to a readout line detecting a current corresponding to the contact capacitance.

10 Claims, 19 Drawing Sheets

(51) Int. Cl.
   *G06K 9/00*      (2006.01)
   *G09G 3/36*      (2006.01)
   *G09G 3/3225*    (2016.01)

(52) U.S. Cl.
   CPC ....... G06K 9/00013 (2013.01); *G09G 3/3225* (2013.01); *G09G 3/3648* (2013.01)

(56) References Cited

U.S. PATENT DOCUMENTS

| | | |
|---|---|---|
| 2011/0169769 A1 | 7/2011 | Takahashi |
| 2011/0310044 A1 | 12/2011 | Higuchi |
| 2015/0029421 A1 | 1/2015 | Gu et al. |
| 2016/0042216 A1 | 2/2016 | Yang et al. |
| 2016/0098140 A1 | 4/2016 | Lee et al. |

FOREIGN PATENT DOCUMENTS

| | | |
|---|---|---|
| KR | 10-2011-0057501 | 6/2011 |
| KR | 10-1136153 | 4/2012 |
| KR | 10-1432988 | 8/2014 |

OTHER PUBLICATIONS

Notice of Allowance dated Apr. 11, 2017, in U.S. Appl. No. 14/938,316.

DISPLAY APPARATUS CAPABLE OF IMAGE SCANNING AND DRIVING METHOD THEREOF

CROSS-REFERENCE TO RELATED APPLICATIONS

This application is a Continuation of U.S. patent application Ser. No. 14/938,316, filed on Nov. 11, 2015, now issued as U.S. Pat. No. 9,679,182, and claims the benefit under 35 U.S.C. §119 of Korean Application Nos. 10-2014-0156873, filed on Nov. 12, 2014, 10-2014-0190692, filed on Dec. 26, 2014, and 10-2015-0044067, filed on Mar. 30, 2015 which are hereby incorporated by reference in their entirety.

BACKGROUND

Field

The present invention relates to a display apparatus capable of image scanning and a driving method thereof. More specifically, the present invention relates to a display apparatus capable of image scanning with an aperture ratio improved than the conventional one and a driving method thereof.

Discussion of the Background

A touchscreen panel is a device for inputting user command by touching letters or diagrams displayed on the screen of an image display device with a human finger or other touch means, and is used attached to an image display device. The touchscreen panel converts the touch location touched with the human finger, etc. into electrical signals. The electrical signal is used as an input signal.

The touchscreen panel adopts various touch detection methods such as a resistance membrane method, an optical method, a capacitive method, an ultrasonic wave method, etc. According to the capacitive method, the touchscreen panel detects whether a touch is made using the capacitance changing when a touch generating means contacts the screen of a display apparatus. A touchscreen panel of the capacitive method may detect contact by a human finger, a conductive touch pen, etc.

Meanwhile, recently, as security matters are becoming an issue, security issues relating to personal portable devices such as smartphones, tablet PCs, etc. are on the rise. As portable devices are being used more frequently, security is a requisite for e-commerce through portable devices, and according to such needs, biometric data such as fingerprints, iris, face, voice, blood veins, etc. are used.

Among the various biometric information authentication technologies, the most commonly used technology is the authentication technology using fingerprints. Recently, products introducing fingerprint recognition and authentication technology using the same to smartphones and tablet PCs, etc. have been released.

However, in order to graft sensors for fingerprint recognition on portable devices, a separate device for fingerprint recognition needs to be installed, in addition to an image display device, which makes the volume of portable devices bigger.

Also, recently, flexible image display devices are being developed, and in this case, the touchscreen panel applied to the flexible image display device needs to be flexible as well.

Thus, it became necessary to develop a technology granting flexibility, without requiring a separate space for a fingerprint recognition sensor in the portable device, while not bothering the display area.

SUMMARY OF INVENTION

The present invention aims to solve the above problems of the related art. It is an object of the present invention to rapidly increase the magnitude of a signal detected in a sensor, compared with a circuit using electric charge sharing.

It is another object of the present invention to design a contact sensor to be contained in a display unit pixel, so that an image touched on the display screen is scannable at, at least a part of the display apparatus.

It is another object of the present invention to use a transparent transistor and enlarge the area of a pixel electrode, thereby improving image sensitivity of an object to be detected, and integrate a sensor capable of image scanning in a display, thereby increasing integrated spatial efficiency in an electronic device.

According to an embodiment of the present invention for achieving the purpose, there is provided a display apparatus capable of image scanning, including a contact sensor arranged in each unit pixel. The contact sensor includes a pixel electrode forming a contact capacitance by contact with a contact means; a reset transistor where a drain electrode is connected to a node where the contact capacitance is formed, and each of a gate electrode and a source electrode is connected to a first scan line to which a selective signal is applied; an amplifying transistor where a gate electrode is connected to the drain electrode of the reset transistor, and a source electrode is connected to a power input terminal; and a detecting transistor where a drain electrode is connected to the drain electrode of the amplifying transistor, a gate electrode is connected to a second scan line to which a selective signal is applied, and a source electrode is connected to a readout line detecting a current corresponding to the contact capacitance.

The reset transistor, the amplifying transistor, and the detecting transistor may be arranged so as not to overlap a unit color pixel in a color filter layer, and the pixel electrode may be arranged to overlap at least a part of the unit color pixel.

The reset transistor may be turned on by the selective signal from the first scan line and deliver to the drain electrode a signal from the power input terminal applied to the source electrode.

The amplifying transistor may generate a current varying depending on a voltage charged in the contact capacitance and deliver the generated current to the detecting transistor.

The detecting transistor may be turned on by the selective signal from the second scan line and deliver to the readout line the current generated by the amplifying transistor.

In the sensor, the selective signal applied to the second scan line may be applied after the selective signal is applied to the first scan line.

In the sensor, the reset transistor, the amplifying transistor, and the detecting transistor may be formed of a transparent thin film transistor and overlap at least a part of the unit color pixel in a color filter layer.

The display apparatus capable of image scanning may determine whether contact is made to an upper part of the contact sensor and contact condition, based on the current of the readout line detected after the selective signal is supplied to the first and second scan lines.

A passivation layer may be formed between the pixel electrode, and the reset transistor, the amplifying transistor and the detecting transistor, and the pixel electrode may be connected to the drain electrode of the reset transistor or the gate electrode of the amplifying transistor through a contactor formed through an end of the passivation layer.

The pixel electrode may be arranged opposite a substrate in which the reset transistor, the amplifying transistor, and the detecting transistor are arranged, and the pixel electrode may be connected to the drain electrode of the reset transistor or the gate electrode of the amplifying transistor through a via formed through an end of the substrate.

The display apparatus may further include a data line, and at least a part of the reset transistor, the amplifying transistor, the detecting transistor, the pixel electrode, and the signal line constituting each contact sensor of a pair of contact sensors unidirectionally arranged are symmetrical with respect to the data line or the readout line arranged between the pair of contact sensors.

According to an embodiment of the present invention for achieving the above objections, there is provided a display apparatus capable of image scanning, including a sensor array layer including a contact sensor arranged in each unit pixel and a color filter layer including a unit color pixel. The contact sensor includes a transparent pixel electrode forming a contact capacitance by contact with a contact means and arranged to overlap the unit color pixel; a reset transistor receiving a selective signal from a first scan line and delivering an input power signal to the contact capacitance; an amplifying transistor generating a current varying depending on a voltage charged in the contact capacitance; and a detecting transistor receiving a selective signal from a second scan line and detecting the current to deliver the current to a readout line. The reset transistor, the amplifying transistor, and the detecting transistor are arranged so as not to overlap the unit color pixel.

According to an embodiment of the present invention for achieving the above objections, there is provided a method for driving a display apparatus, including the steps of charging a contact capacitance formed between a pixel electrode and a contact means through a reset transistor turned on by receiving a first selective signal; generating a current varying depending on a voltage charged in the contact capacitance through an amplifying transistor; and detecting the generated current through a detecting transistor turned on by receiving a second selective signal, to determine whether contact is made to an upper part of the contact sensor and contact condition.

According to an embodiment of the present invention, the magnitude of a signal to be detected can increase by using a coupling phenomenon occurring from parasitic capacitance included in transistors and peripheral circuit configurations.

Also, according to an embodiment of the present invention, a transparent electrode can be implemented with an enlarged area, thereby allowing for visibility and increasing image sensitivity of a display apparatus.

Also, according to an embodiment of the present invention, a sensor capable of image scanning is integrated in the display screen, thereby increasing integrated spatial efficiency in an electronic device.

DETAILED DESCRIPTION OF THE ILLUSTRATED EMBODIMENTS

Figure 1:
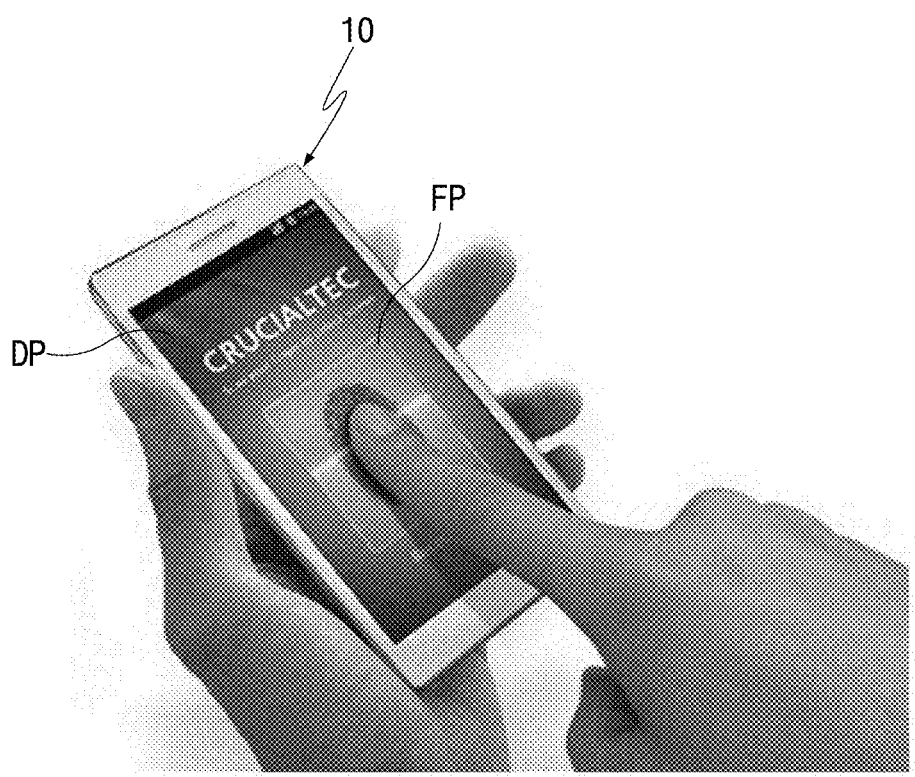
FIG. 1 is a view illustrating an image of an electronic equipment according to an embodiment of the present invention.

Hereinafter, the present invention will be explained with reference to the accompanying drawings. The present invention, however, may be modified in various different ways, and should not be construed as limited to the embodiments set forth herein. Also, in order to clearly explain the present invention, portions that are not related to the present invention are omitted, and like reference numerals are used to refer to like elements throughout.

Throughout the specification, it will be understood that when an element is referred to as being "connected to" another element, it may be "directly connected to" the other element, or intervening elements or layers may be present. Also, it will also be understood that when a component "includes" an element, unless there is another opposite description thereto, it should be understood that the component does not exclude another element but may further include another element.

In the present specification, "contact recognition" means a function recognizing an object in contact with a surface, and it should be understood to cover recognition of fingerprint or touch by a human finger, or recognition of touch by other touch generating means.

Hereinafter, examples of the present invention will be explained in more detail with reference to the accompanying drawings.

FIG. 1 is a view illustrating an image of an electronic equipment according to an embodiment of the present invention.

Referring to FIG. 1, an electronic equipment 10 according to an embodiment includes a display apparatus DP.

The electronic equipment 10 may be a digital equipment including wireless or wired communication functions or other functions. For example, it may be a digital equipment with operation skills including a memory means and a microprocessor, such as mobile phones, navigations, web pads, PDAs, workstations, personal computers (e.g., laptop computers, etc.). Smartphone will be presented as a preferable example, but electronic equipment is not necessarily limited thereto.

A display apparatus DP is formed on a surface of an electronic equipment 10. Preferably, as illustrated in FIG. 1, the display apparatus may be formed on a front surface of an electronic equipment 10 and implemented as a touchscreen panel performing the function as an input device as well.

According to an embodiment of the present invention, the display apparatus DP may perform the function of recognizing a fingerprint, in addition to detecting whether contact is made by a touch generating means (for example, finger, etc.) and the contact location.

Specifically, when driving a first application, the display apparatus DP may function as a touchscreen for driving a specific function, and when driving a second application, the fingerprint recognition function may be implemented in the fingerprint input window FP area displayed on the display apparatus DP or the entire area of the display apparatus DP.

As will be described below, touch by a touch generating means or contact by a ridge and valley of a fingerprint is made by sensors consisting of a plurality of rows and columns. In order to recognize fingerprints, contact by the ridge and contact by the valley need to be distinguished from one another. Thus, the resolution of sensing contact associated with the number of sensors included in the display apparatus DP should be formed to an extent to distinguish the contact by the ridge from the contact by the valley of fingerprints.

FIGS. 2A, 2B, 2C and 2D are cross-sectional views illustrating the constitution of a display apparatus having an image scanning function according to an embodiment of the present invention. FIGS. 2A, 2B, 2C and 2D present a constitution integrating the image scanning function into a liquid crystal display (LCD) as an example.

Referring to FIGS. 2A, 2B, 2C and 2D, the LCD includes a first substrate 210, a thin film transistor layer 220, a liquid crystal layer 230, a color filter layer 240, a second substrate 250, and a cover window 260, layered in order.

The LCD is operated by a principle implementing the desired color and image by allowing light illuminated from a back light unit (BLU) placed on the lower part of a first substrate 210 to penetrate into a liquid crystal layer 230, and then pass through a color filter layer 240 implementing colors by extracting colors in pixel units. The thin film transistor layer 220 has a function of delivering or controlling electronic signals, and the liquid crystal present on the liquid crystal layer 230 controls the penetration of light by varying molecular structure according to the applied electronic signal.

The sensor array layer 300 performing the function of detecting contact by a touch generating means or recognizing fingerprints according to an embodiment of the present invention, i.e., performing the image scanning function, may be arranged on a certain area of the LCD.

Figure 2A:
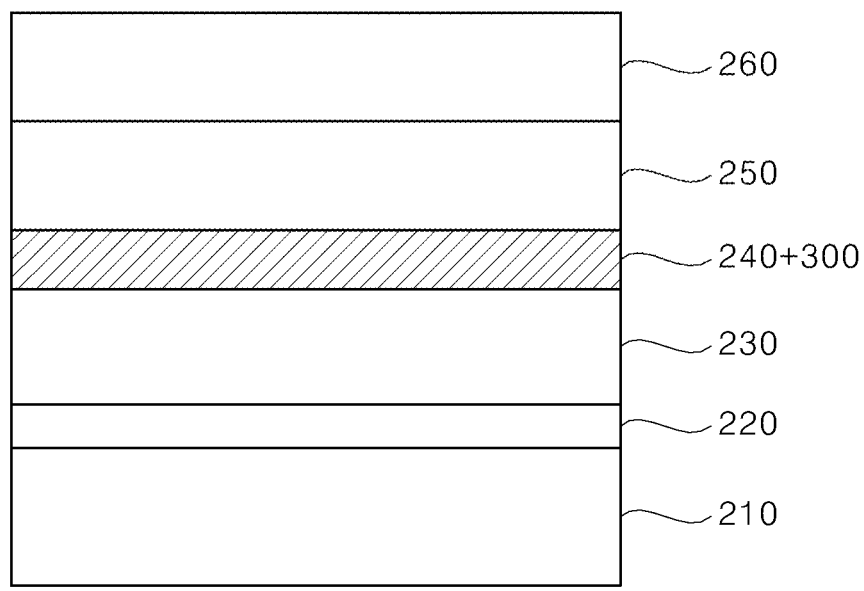
FIGS. 2A, 2B, 2C and 2D are cross-sectional views illustrating the constitution of a display apparatus having an image scanning function according to an embodiment of the present invention.

First, as illustrated in FIG. 2A, the sensor array layer 300 according to an embodiment may be arranged in a layer adjacent the color filter layer 240. In this case, the sensor array layer 300 may be arranged in a lower area of the color filer layer 240 or in an area between a color filter area 240 and a second substrate 250.

Figure 2B:
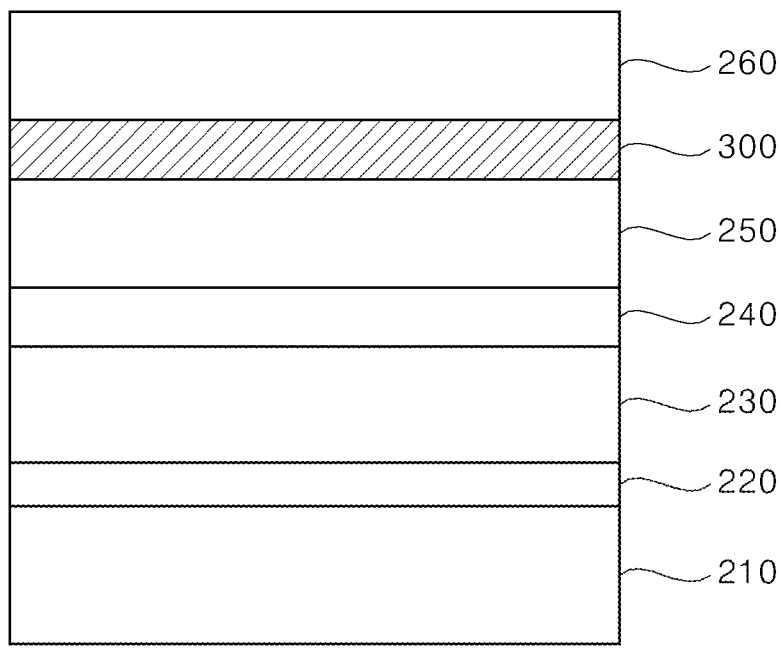
Figure 2C:
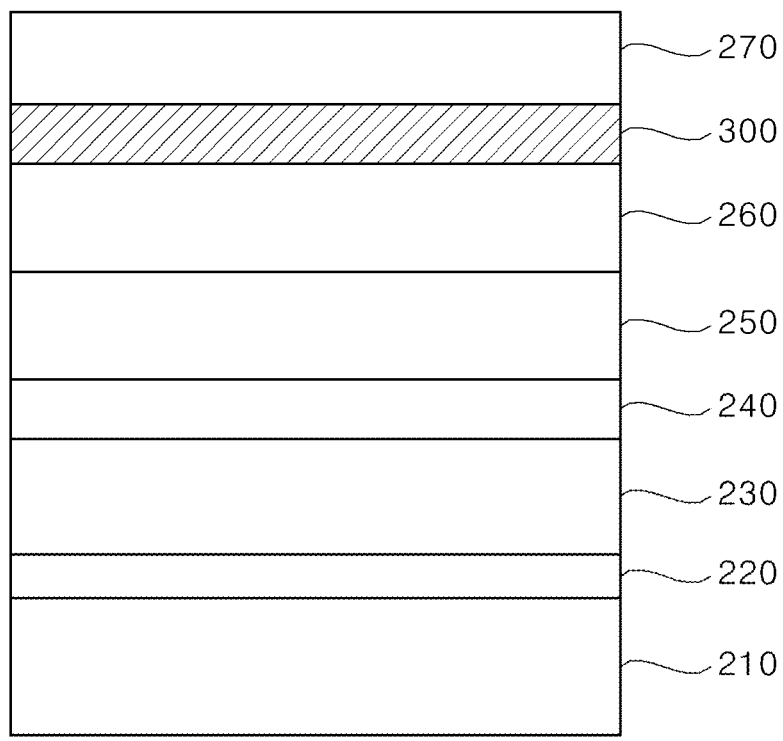

Next, as illustrated in FIG. 2B, the sensor array layer 300 according to an embodiment may be arranged between a second substrate 250 and a cover window 260, and as illustrated in FIG. 2C, the sensor array layer may be arranged in the upper part of the cover window 260 to protect the display apparatus.

As illustrated in FIG. 2C, when a sensor array layer 300 is arranged in the upper part of the cover window 260, a separate protective layer 270 should be formed on top of it in order to protect the sensor array layer 300.

Figure 2D:
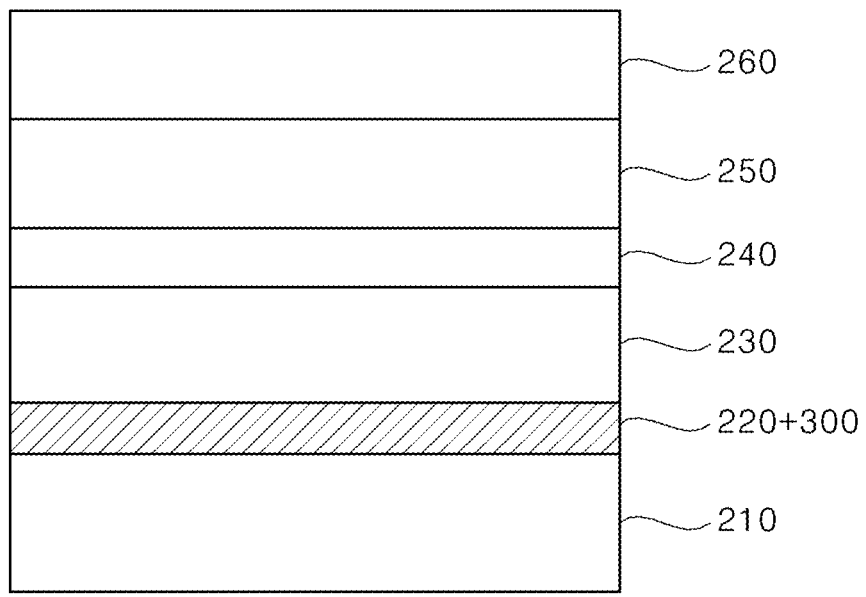

Meanwhile, as illustrated in FIG. 2D, the sensor array layer 300 according to an embodiment may be formed on the same layer as the thin film transistor layer 220 implemented with circuits for driving the display apparatus.

In the above, an example of implementing the display apparatus as an LCD was explained. However, it is obvious that the display apparatus may be implemented as other types of display apparatuses such as an organic light emitting diode (OLED) display apparatus or an electro phoretic display (EPD), etc.

The OLED display apparatus may be formed in a structure having OLED elements formed with electrode layers on both surfaces, arranged on the substrate. However, in this case, the sensor array layer 300 having an image scanning function according to an embodiment of the present invention may be formed on the upper part of the substrate or the upper part of the OLED element, etc.

Figure 3:
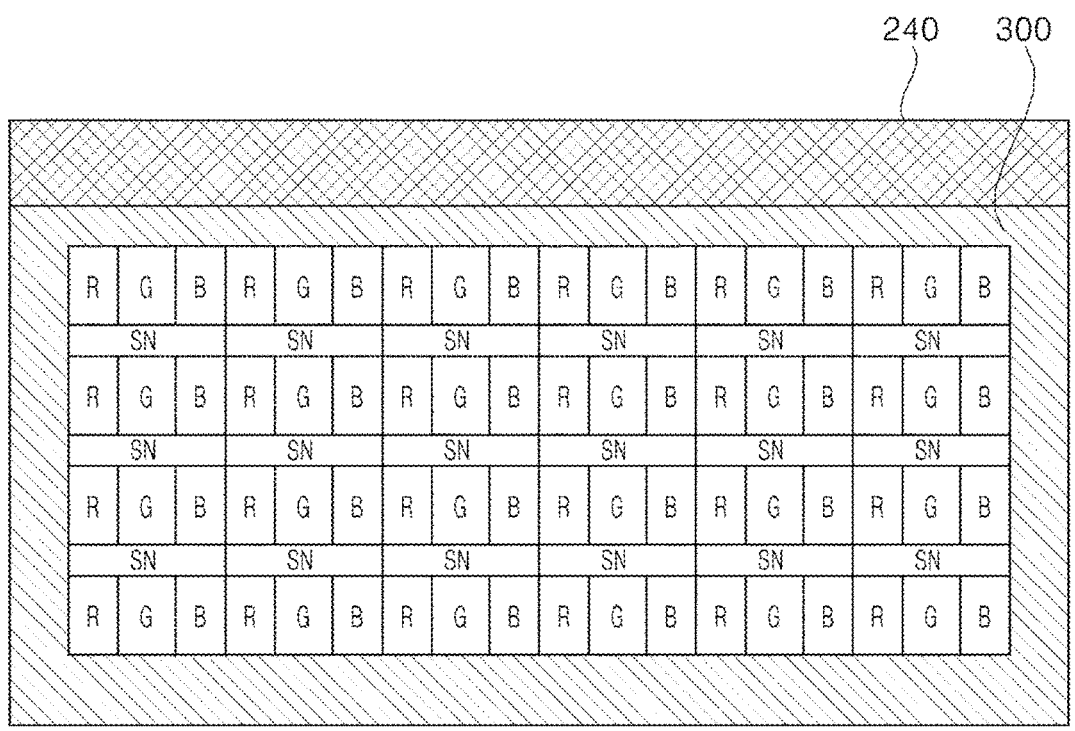
FIG. 3 is a plan view illustrating the constitution of the display apparatus according to an embodiment of the present invention.

FIG. 3 is a plan view illustrating the constitution of the display apparatus according to an embodiment of the present invention.

FIG. 3 illustrates a color filter layer 240 and a sensor array layer 300. As illustrated above, the sensor array layer 300 may be formed on a relatively upper part with respect to the color filter layer 240, or on its lower part.

The sensor array including a plurality of contact sensors according to an embodiment may be formed on the front surface of the display, and may be formed on a certain area of the display according to another embodiment. When the sensor array is formed on a certain area of the display, an area without a contact sensor may be configured so that there is no step between the area and an area with a contact sensor through passivation (not shown).

The contact sensor SN may be implemented as a capacitive method sensor including a plurality of transistors.

The color filter layer 240 may be configured to include red pixels R indicating red images, green pixels G indicating green images, and blue pixels B indicating blue images. Each one of the red pixel R, green pixel G, and blue pixel B forms one unit color pixel, and it may be explained that these unit color pixels are formed in the form of a matrix consisting of a plurality of rows and columns. Accordingly, one unit pixel may include one contact sensor SN.

According to an embodiment, the contact sensor SN is formed on the sensor array layer 300, and when viewed from the top, the sensing circuit (e.g., transistor and wirings) of the contact sensor SN is arranged in an area not overlapping the red pixel R, green pixel G and blue pixel B of the color filter layer 240, and the pixel electrode of the contact sensor SN may be arranged in an area overlapping at least a part of the color pixels (R, G or B) as a transparent electrode material such as ITO, etc. or in a certain area not overlapping the color pixels. FIG. 3 illustrates providing a contact sensor SN at the lower part of the unit pixel. However, the contact sensor may be provided at the upper part or side surface part, etc. of the unit pixel. Also, one of the red pixel R, green pixel G, and blue pixel B may be made to be relatively smaller so as to place the sensing circuit of the contact sensor SN in a corresponding location.

According to another embodiment, when using a transparent electrode material for the transistor and wiring, the contact sensor SN may be formed to overlap the red pixel R, green pixel G and blue pixel B of the color filter layer 240 up to the sensing circuit, in addition to the pixel electrode, in the sensor array layer 300. Accordingly, since the contact sensor SN may be formed to overlap unit pixels, the resolution of image sensing may increase by arranging at least two contact sensors SN for each unit pixel, and the sensitivity of image sensing may be improved by forming the unit contact sensor SN to be larger.

Figure 4:
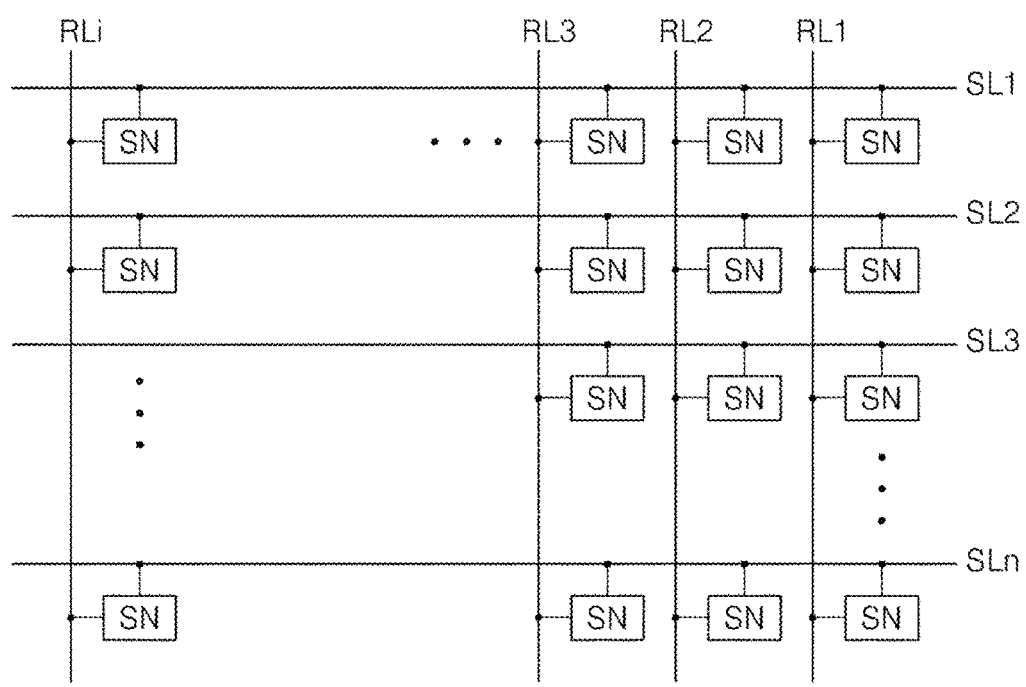
FIG. 4 is a view illustrating the constitution of a sensor array layer implementing the image scanning function according to an embodiment of the present invention.

FIG. 4 is a view illustrating the constitution of a sensor array layer implementing the image scanning function according to an embodiment of the present invention.

Referring to FIG. 4, the sensor array layer 300 includes a plurality of scan lines (SL1, SL2, . . . SLn) and a plurality of readout lines (RL1, RL2, . . . RL1). The plurality of scan lines (SL1, SL2, . . . SLn) are provided with scan signals in order, and the plurality of readout lines (RL1, RL2, . . . RL1) receive signals outputted from the contact sensor SN and deliver them to a circuit (not shown) which processes the signals.

According to an embodiment, the scan signal provided to the plurality of scan lines may be provided from a scan driver of the sensor array layer 300.

The scan lines (SL1, SL2, . . . , SLn) and readout lines (RL1, RL2, . . . , RL1) are arranged to intersect one another, and at least one contact sensor SN may be formed at each intersection.

Figure 5A:
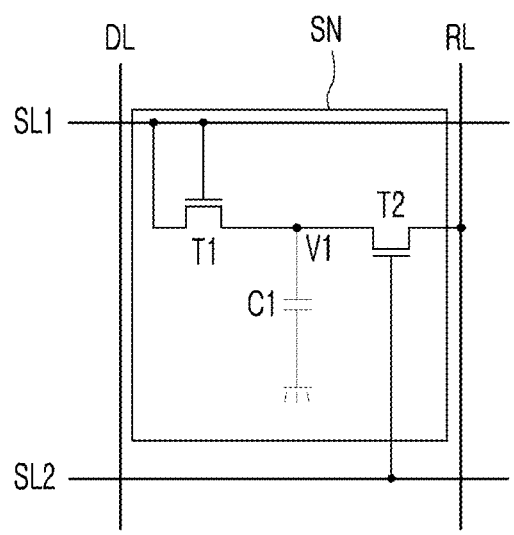
FIGS. 5A and 5B are circuit diagrams illustrating an exemplary embodiment of a contact sensor arranged in a sensor array.
Figure 5B:
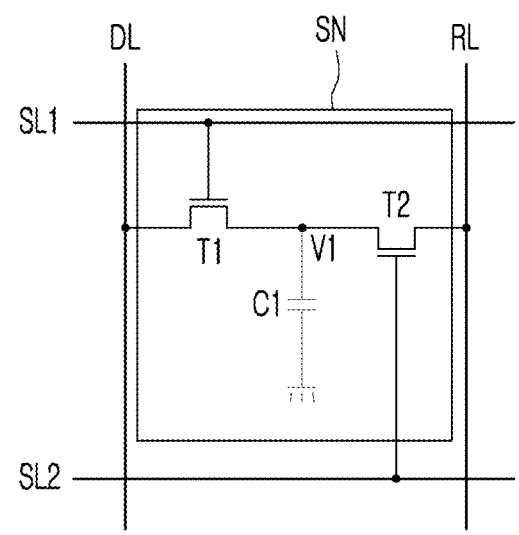

FIGS. 5A and 5B are circuit diagrams illustrating an exemplary embodiment of a contact sensor SN arranged in a sensor array layer 300.

Referring to FIGS. 5A and 5B, the contact sensor SN may include a pixel electrode (not shown), a switch transistor T1, and a sensing transistor T2. When a contact means contacts the pixel electrode, a contact capacitance C1 may be formed.

In FIG. 5A, a gate electrode and a drain electrode of the switch transistor T1 are connected to a first scan line SL1, and a source electrode is connected to a node where the contact capacitance C1 is formed. A drain electrode of the sensing transistor T2 is connected to a readout line RL, a source electrode is connected to the source electrode of the switch transistor T1, and a gate electrode is connected to a second scan line SL2.

Comparing FIG. 5B with FIG. 5A, FIG. 5B differs from FIG. 5A in that the drain electrode of the switch transistor T1 is connected to a data line DL, not to the first scan line.

When a selective signal of the first scan line SL1 is supplied to the gate electrode of the switch transistor T1, the switching transistor T1 is turned on to charge the contact capacitance C1. When a selective signal is applied to the second scan line SL2, the sensing transistor T2 is turned on accordingly, to share electric charges charged in the contact capacitance C1 between the contact capacitance C1 and the parasitic capacitance of the readout line RL.

Specifically, as the contact means approaches the contact sensor SN closely, a greater contact capacitance C1 is formed between the contact means and the contact sensor SN. As the contact means retreats away from the contact sensor SN, the contact capacitance C1 is reduced in size.

Thereafter, a signal voltage of the readout line RL is delivered to a separate IC chip, and the screen contact, contact area, and the like for the pixel may be identified through the delivered signal voltage. In other words, the readout line RL senses, as a voltage, a signal corresponding to an amount of electric charge charged in the contact sensor SN, and the contact and condition thereof can be identified through the magnitude of the thus-sensed voltage.

According to a manner illustrated in FIGS. 5A and 5B, electric charges stored in the contact capacitance C1 are delivered to the readout line RL through the sensing transistor T2, and parasitic capacitance is to be present in the contact sensor SN by the circuit configurations on the periphery of the contact capacitance C1, the sensing transistor T2, and the readout line RL, or the correlation with other constituent elements. Accordingly, the contact sensor SN senses a voltage through electric charges sharing between the contact capacitance C1 and the parasite capacitance of the readout line RL. Thus, the parasite capacity of the readout line RL is relatively greater than the contact capacitance C1, which leads to a very low voltage to be sensed.

Figure 6:
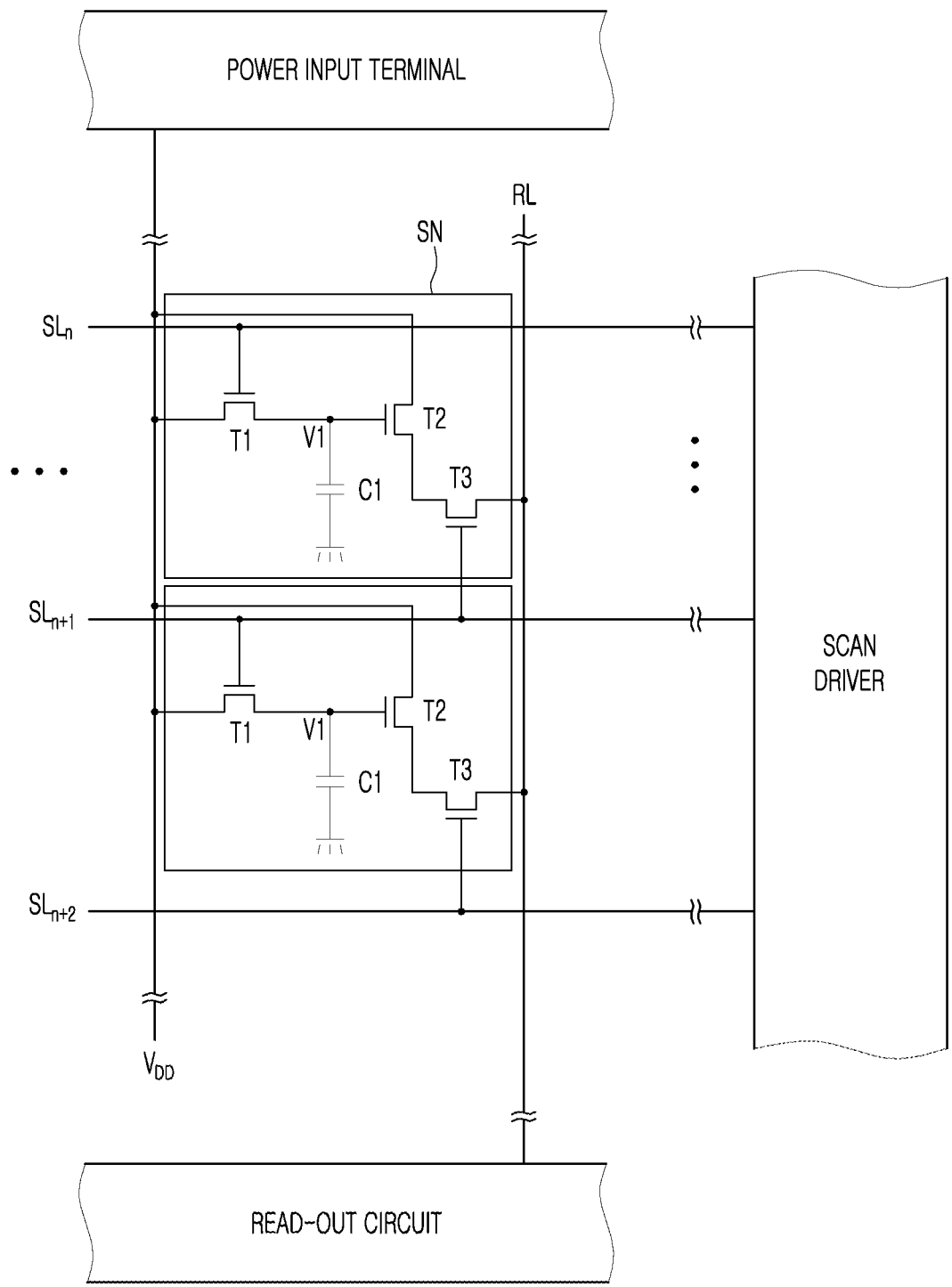
FIG. 6 is a circuit diagram illustrating the configuration of a capacitive contact sensor applicable for a display apparatus according to an embodiment of the present invention.

FIG. 6 is a circuit diagram illustrating the configuration of a capacitive contact sensor applicable for a display apparatus according to an embodiment of the present invention.

Referring to FIG. 6, the contact sensor SN according to an embodiment of the present invention is included in at least a part of a unit pixel formed in the sensor array layer 300 explained in connection with FIG. 2.

Each contact sensor SN may include a pixel electrode and three transistors. The three transistors may be a reset transistor T1, an amplifying transistor T2, and a detecting transistor T3. Each transistor T1 to T3 may be implemented as a silicon transistor including hydrogenated amorphous silicon (a-Si:H), poly silicon (Poly-Si), oxide transistor, etc., or an organic compound transistor including an organic thin film transistor, etc., forming a channel area with an organic substance. Each transistor T1 to T3 may be implemented as a thin film transistor having coplanar, staggered, inverted coplanar, or inverted staggered structure.

Each transistor T1 to T3 may be formed of a transparent thin film transistor (TTFT). A transparent thin film transistor has the property of passing the wavelength in the area of visible light. Accordingly, in combination with a display apparatus, visibility can be obtained.

According to an embodiment, each transistor T1 to T3 may be arranged so as not to overlap a unit color pixel in the color filter layer 240, and the pixel electrode may be arranged to overlap at least a part of the unit color pixel. According to an embodiment, when each transistor T1 to T3 is implemented as a transparent thin film transistor, the transistors may be formed to overlap the color pixel.

The reset transistor T1 resets, to a constant level, residual electric charges of the pixel electrode connected to the amplifying transistor T2, when a signal of the scan line SLn is applied.

The gate electrode of the reset transistor T1 may be connected to the scan line SLn, the source electrode may be connected to the power input terminal Vdd, and the drain electrode may be connected to the pixel electrode.

The amplifying transistor T2 serves as an amplifier receiving from the gate electrode a voltage V1 at the contact capacitance C1 generated between the contact means and the pixel electrode (sensing electrode) and delivering, as a current signal, the amount of voltage change to the detecting transistor T3.

The gate electrode of the amplifying transistor T2 may be connected to the pixel electrode (sensing electrode), the source electrode may be connected to the power input terminal Vdd, and the drain electrode may be connected to the drain electrode of the detecting transistor T3.

The detecting transistor T3 selectively passes a current flowing in the amplifying transistor T2 to the readout line RL. The detecting transistor T3 passes a current flowing in the amplifying transistor T2 to the readout line RL, by a selective signal received from a scan line SLn+1 which is applied to the gate electrode.

The gate electrode of the detecting transistor T3 may be connected to the scan line SLn+1, the drain electrode may be connected to the drain electrode of the amplifying transistor T2, and the source electrode may be connected to the readout line RL.

According to an embodiment, an opening may be formed at the center of pixel electrodes included in the contact sensor SN, and each transistor T1 to T3 may be arranged around the electrode edges. Specifically, a pixel electrode of a transparent material for generating the contact capacitance C1 by contact with the contact means may be designed to be arranged at the center of the unit pixel. Each transistor T1 to T3 may be arranged on the periphery of the location where the pixel electrode is generated. For example, each transistor T1 to T3 may be arranged in an area not overlapping the electrode edges or color pixels in order to obtain display visibility.

Figure 7:
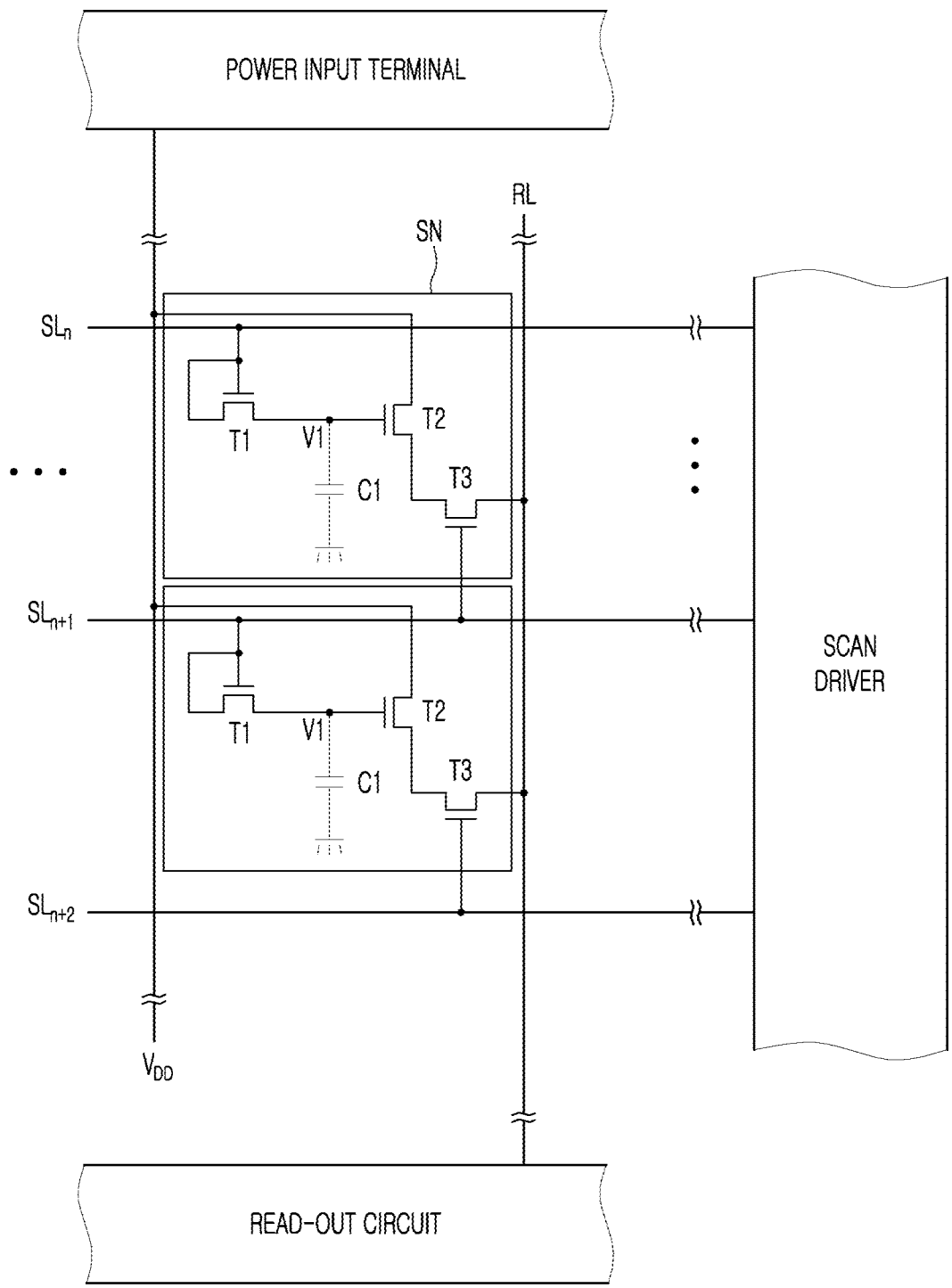
FIGS. 7, 8, and 9 are circuit diagrams illustrating the constitution of capacitive contact sensors according to embodiments of the present invention.
Figure 8:
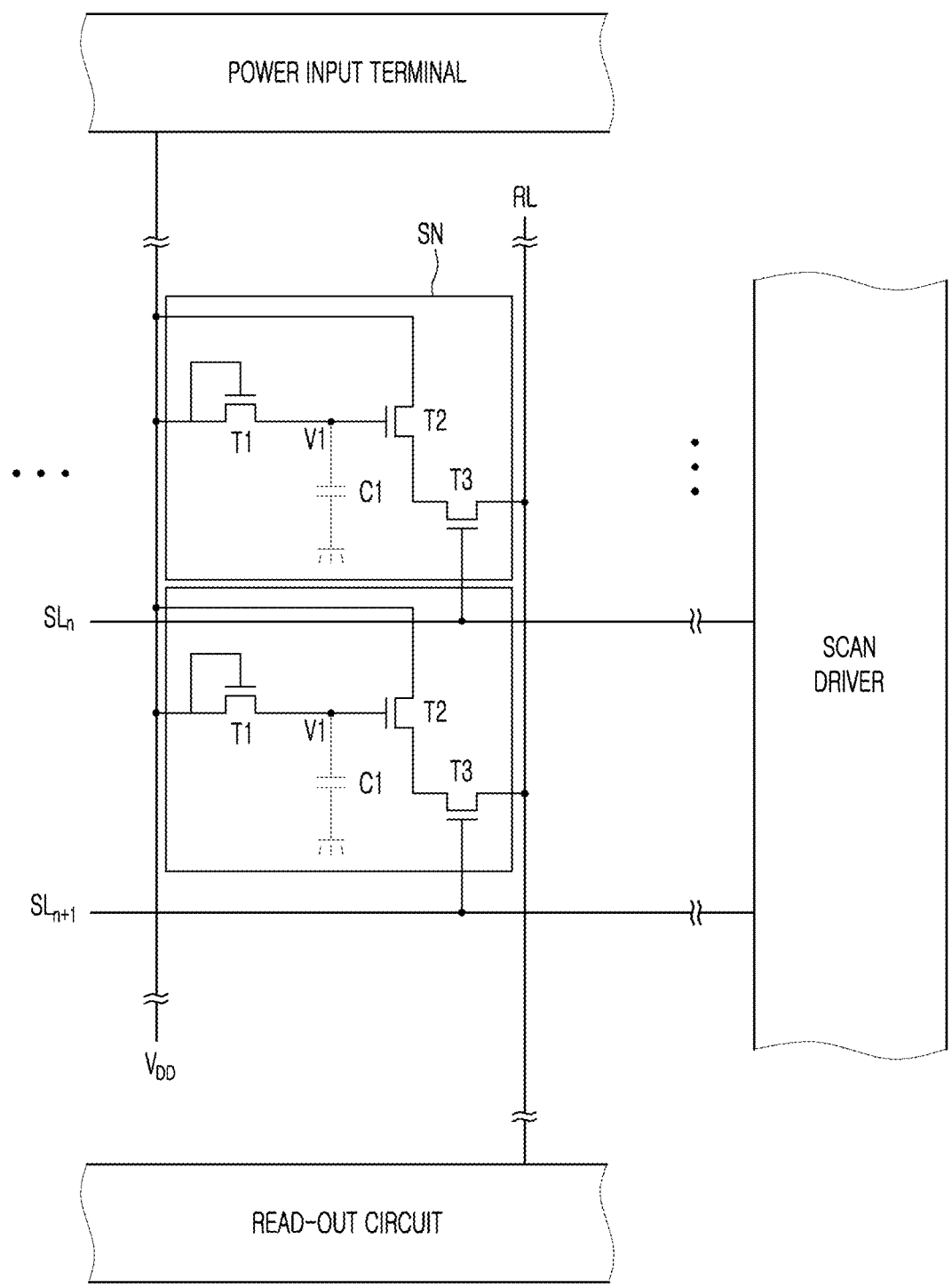
Figure 9:
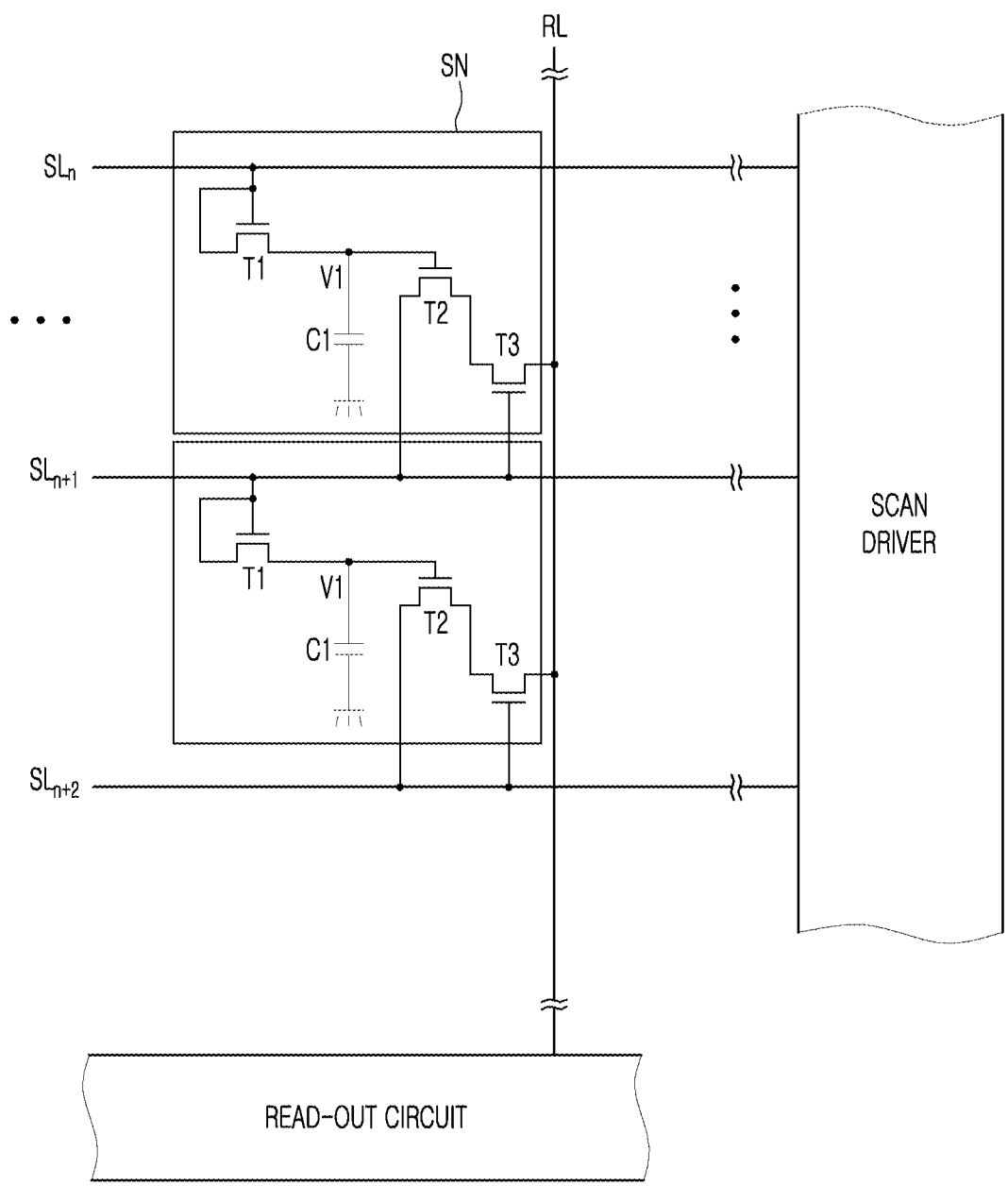

FIGS. 7, 8, and 9 are circuit diagrams illustrating the configurations of capacitive contact sensors according to embodiments of the present invention.

Referring to FIG. 7, the configuration of the contact sensor SN illustrated in FIG. 6 may be changed only in the connection of the reset transistor T1. Specifically, the source electrode of the reset transistor T1 may be connected to the gate electrode, not to the power input terminal Vdd. Accordingly, when a selective signal is applied to the gate electrode from the scan line SLn, the same selective signal is also applied to the source electrode. Thus, a separate power input terminal may not be needed in driving the contact sensor SN.

Referring to FIG. 8, the configuration of the contact sensor SN illustrated in FIG. 7 may be changed only in the connection of the reset transistor T1. In the circuit diagram of FIG. 7, the source electrode and the gate electrode of the reset transistor T1 are connected together to the scan line SLn. However, in the circuit diagram of FIG. 8, the source electrode and the gate electrode of the reset transistor T1 may be connected together to the power input terminal Vdd.

The above circuit configuration of the contact sensor SN can reduce the number of scan lines SLn required for driving each contact sensor. When viewed as a whole, the number of scan lines SLn is reduced by one, but as the number of scan lines required for driving each contact sensor SN is reduced from two to one, the operation of a scan driver may be simplified.

Referring to FIG. 9, in the circuit configuration of the contact sensor SN disclosed in the present invention, the contact sensor SN may be driven only with the scan line SLn, by removing the power input terminal Vdd.

Specifically, the source electrode of the amplifying transistor T2 may receive a voltage input from the scan line SLn, instead of power input terminal Vdd, for operation. To this end, a scan driver may be driven to deliver a signal at an operation timing of the amplifying transistor T2.

As such, the removal of the power input terminal Vdd may simplify the circuit configuration of the contact sensor SN.

Figure 10:
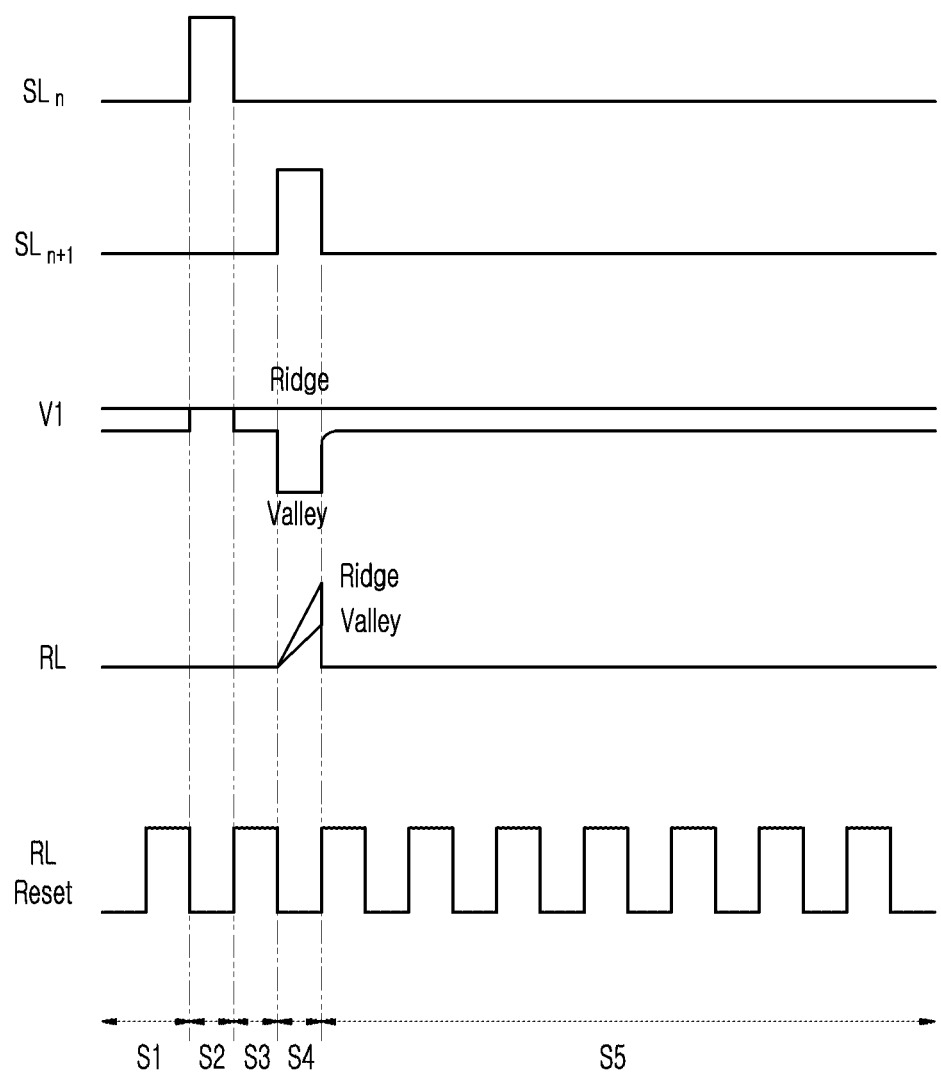
FIG. 10 is a timing diagram for explaining the operation of a contact sensor according to an embodiment of the present invention.

FIG. 10 is a timing diagram for explaining the operation of a contact sensor according to an embodiment of the present invention.

Referring to FIGS. 6, 7, 8, 9, and 10, the operation of the contact sensor SN according to an embodiment of the present invention is described as follows.

In FIG. 10, SLn and SLn+1 are indicative of signals supplied to the scan lines SLn and SLn+1, respectively, and should be construed that a selective signal is supplied to the scan lines SLn and SLn+1, during a high period. A specific contact sensor SN is selected by the application of selective signal, and the signal is output from another contact sensor SN which is connected to the N−1th scan line, when the selective signal is applied to the Nth scan line. Hereinafter, "SL" is used to refer to a scan line signal. Also, RL Reset refers to a signal for resetting the readout line RL, and a reset signal is supplied in a high period, to reset the readout line RL.

Meanwhile, V1 is indicative of potential of the pixel electrode (sensing electrode) which is connected to the gate electrode of the amplifying transistor T2, i.e., potential by electric charges charged in the contact capacitance C1 generated between the contact means and the pixel electrode (sensing electrode). RL is indicative of an amount of current detected in the readout line RL which is connected to the source electrode of the detecting transistor T3.

In the timing diagram of V1 and RL, the voltage V1 according to the amount of electric charge charged in the contact capacitance C1 and the current of the readout line RL vary depending on whether a ridge or a valley touches the pixel electrode of the contact sensor SN.

First, a case is described where no contact means contacts the contact sensor SN. As no contact means is present, no contact capacitance C1 formed between the pixel electrode and the contact means is present.

When the scan line signal SLn connected to the gate electrode of the reset transistor T1 is converted into a high level, the reset transistor T1 is turned on, and a constant amount of electric charges is charged in the pixel electrode which is connected to the drain electrode of the reset transistor T1 through a voltage input through the power input terminal Vdd which is connected to the source electrode of the reset transistor T1. Accordingly, the voltage V1 rises.

The source electrode of the amplifying transistor T2 is also connected to the power input terminal Vdd, to receive an input voltage. However, the correlation between the gate voltage V1 and the source electrode of the amplifying transistor T2 is designed not to exceed a threshold voltage of the amplifying transistor T2, in a state where the valley of fingerprint contacts the contact sensor SN and thus the contact capacitance C1 is small. Accordingly, no current is detected in the readout line RL, as no current is present passing from the drain electrode of the amplifying transistor T2 to the detecting transistor T3 (S2 period).

Next, a case where the valley of fingerprint contacts the contact sensor SN, and a case where the ridge contacts the contact sensor SN are described. As the valley or ridge of fingerprint contacts the contact sensor SN, the contact capacitance C1 is formed between the contact means and the pixel electrode in the contact sensor SN. Here, different sizes of contact capacitance C1 are generated for each case where the valley and the ridge contact the pixel electrode.

As a selective signal is applied in S2 period to the scan line SLn which is connected to the gate electrode of the reset transistor T1, the reset transistor T1 is turned on and the signal from the power input terminal Vdd is delivered through the drain electrode of the reset transistor T1. Thereby, the contact capacitance C1 is charged.

The magnitude of voltage V1 charged in the contact capacitance C1 varies depending on the size of generated contact capacitance C1. The size of contact capacitance C1 is smaller when the valley of fingerprint contacts the contact sensor SN than when the ridge of fingerprint contacts the contact sensor SN, based on a distance between the pixel electrode and the valley or ridge of fingerprint.

The case where the valley of fingerprint contacts the pixel electrode is described first. When a high signal is applied to the first scan line SLn (S2), the voltage V1 of the contact capacitance C1 increases by the current flowing from the source electrode to the drain electrode of the reset transistor T1. Then, when the high signal is applied to the second scan line SLn+1 (S4), as the detecting transistor T3 is turned on, the potential at the source electrode of the amplifying transistor T2 is down to 0. Accordingly, the voltage V1 of the contact capacitance C1 decreases due to the coupling by parasite capacitance formed between the gate and the source of the amplifying transistor T2. Also, as the high signal of the second scan line SLn+1 is applied to the gate electrode of the detecting transistor T3 (S4), the detecting transistor T3 is turned on. When the detecting transistor T3 is turned on, the current flowing from the drain electrode of the amplifying transistor T2 flows to the source electrode of the detecting transistor T3 through the drain electrode, and finally to the readout line RL. In this case, as the voltage V1 of the contact capacitance C1 is low, the current flowing to the readout line RL may be smaller than the case where the ridge contacts the pixel electrode.

The case where the ridge of fingerprint contacts the pixel electrode is described. When a high signal is applied to the first scan line SLn (S2), the voltage V1 of the contact capacitance C1 increases. Here, as the contact capacitance C1 is relatively greater than the case where the valley contacts the pixel electrode. Accordingly, no coupling occurs by parasite capacitance formed between the gate and the source of the amplifying transistor T2. Thus, the voltage V1 of the contact capacitance C1 may remain constantly. Thereafter, when the high signal is applied to the second scan line SLn+1 (S4), the detecting transistor T3 is turned on, and the current flowing from the drain electrode of the amplifying transistor T2 flows to the drain electrode of the detecting transistor T3 through the source electrode. Then, the current is detected at the readout line RL. In this case, as no coupling occurs by parasite capacitance, the voltage at the gate electrode of the amplifying transistor T2 remains constantly. Accordingly, a greater amount of current flows compared with the case where the valley contacts the pixel electrode.

Thereafter, whether the ridge or valley of fingerprint contacts the pixel electrode, the contact area, and the like can be determined based on the variation pattern of the magnitude of current detected by the readout line RL.

As such, according to an embodiment of the present invention, when a signal is applied to the scan line, the reset transistor T1 resets the circuit. Thus, a separate reset line is not necessary. According to the present invention, the circuit configuration can be simplified as no wiring other than the scan line is necessary. Also, when a selective signal is applied to the scan line which is connected to the gate electrode of the detecting transistor T3, a single scan line can detect a signal in the readout line RL included in one contact sensor SN and control the operation of the reset transistor T1 included in another contact sensor SN, at the same time, as the gate electrode of the reset transistor T1 in another contact sensor SN is also connected to the scan line.

According to an embodiment of the present invention, the amplifying transistor T2 operates according to the variation of the contact capacitance C1. Accordingly, the disadvantage that a signal detected in a charge sharing circuit becomes low can be improved.

Also, according to an embodiment of the present invention, a transparent thin film transistor and transparent electrodes are used, and an opening is formed at the center of the unit pixel. Accordingly, the aperture ratio of the display apparatus can increase.

Figure 11:
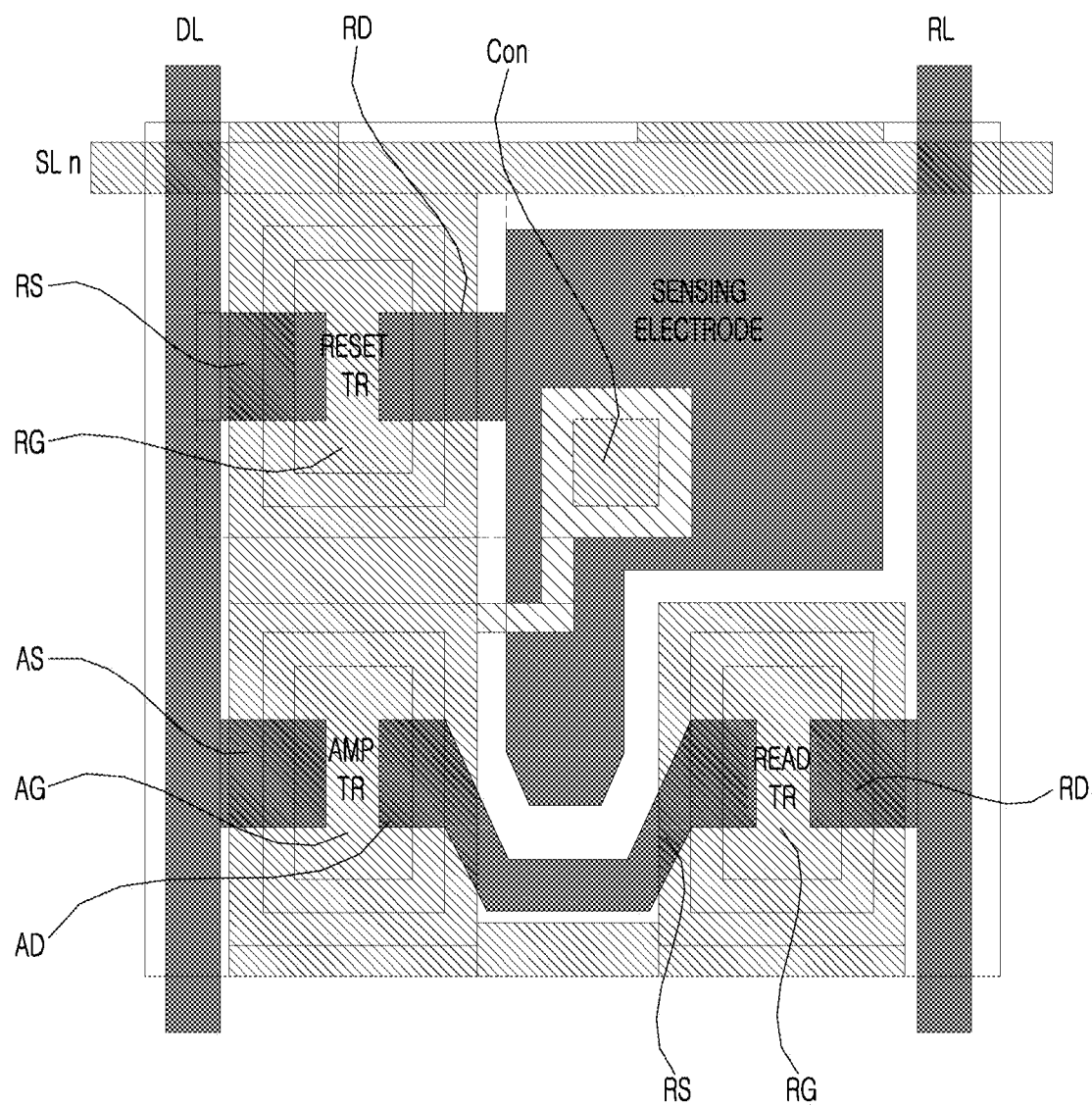
FIG. 11 is a plan view illustrating a contact sensor according to an embodiment of the present invention.

FIG. 11 is a plan illustrating a contact sensor SN according to an embodiment of the present invention.

Referring to FIGS. 6 and 11, the reset transistor T1 corresponds to Reset TR illustrated at the top left side of FIG. 11, the amplifying transistor T2 corresponds to Amplification TR (Amp TR) at the bottom left side, and the detecting transistor T3 corresponds to Detection TR (Read TR) at the bottom right side.

The gate electrode RG of the reset transistor T1 may be connected to the scan line SLn, the source electrode RS may be connected to the power input terminal Vdd, and the drain electrode RD may be connected to the pixel electrode (sensing electrode).

The gate electrode AG of the amplifying transistor T2 may be connected to the pixel electrode (sensing electrode) through a contactor Con, the source electrode AS may be connected to the power input terminal Vdd, and the drain electrode AD may be connected to the source electrode RS of the detecting transistor T3.

The gate electrode RG of the detecting transistor T3 may be connected to the scan line SLn+1, the source electrode RS may be connected to the drain electrode AD of the amplifying transistor T2, and the drain electrode RD may be connected to the readout line RL.

According to an embodiment, when each transistor T1 to T3 is implemented as an oxide transistor, the properties of the oxide may vary depending on incident light. Accordingly, the contact sensor SN may further include a shield electrode. The shield electrode may be arranged to overlap each transistor T1 to T3 as shown in a blue diagonal line area in FIG. 11, to block out light frog outside.

Here, the pixel electrode receives the voltage V1 at the contact capacitance C1 generated between the contact means and the pixel electrode (sensing electrode) through the gate electrode AG of the amplifying transistor T2, and delivers a current signal with a magnitude which is proportional to the change amount of the voltage V1.

However, the contact capacitance C1 increases in proportion to the contact area between the finger and the pixel electrode. Accordingly, in order to implement the pixel electrode (sensing electrode) with each transistor T1 to T3 on the same plane, as illustrated in an embodiment of FIG. 11, the contact sensor SN may be implemented to minimize the area each transistor T1 to T3 occupies and maximize the area the pixel electrode occupies.

According an embodiment, when light transmission of at least one electrode material of the source electrode, the drain electrode, or the gate electrode for implementing each transistor T1 to T3 is low, each transistor T1 to T3 may be implemented in an area not overlapping color pixels R, G, B, as illustrated in FIG. 3, and the pixel electrode may be implemented in an area overlapping color pixels. In this case, fingerprint image scanning is possible, while not disturbing visibility of the display.

Figure 12:
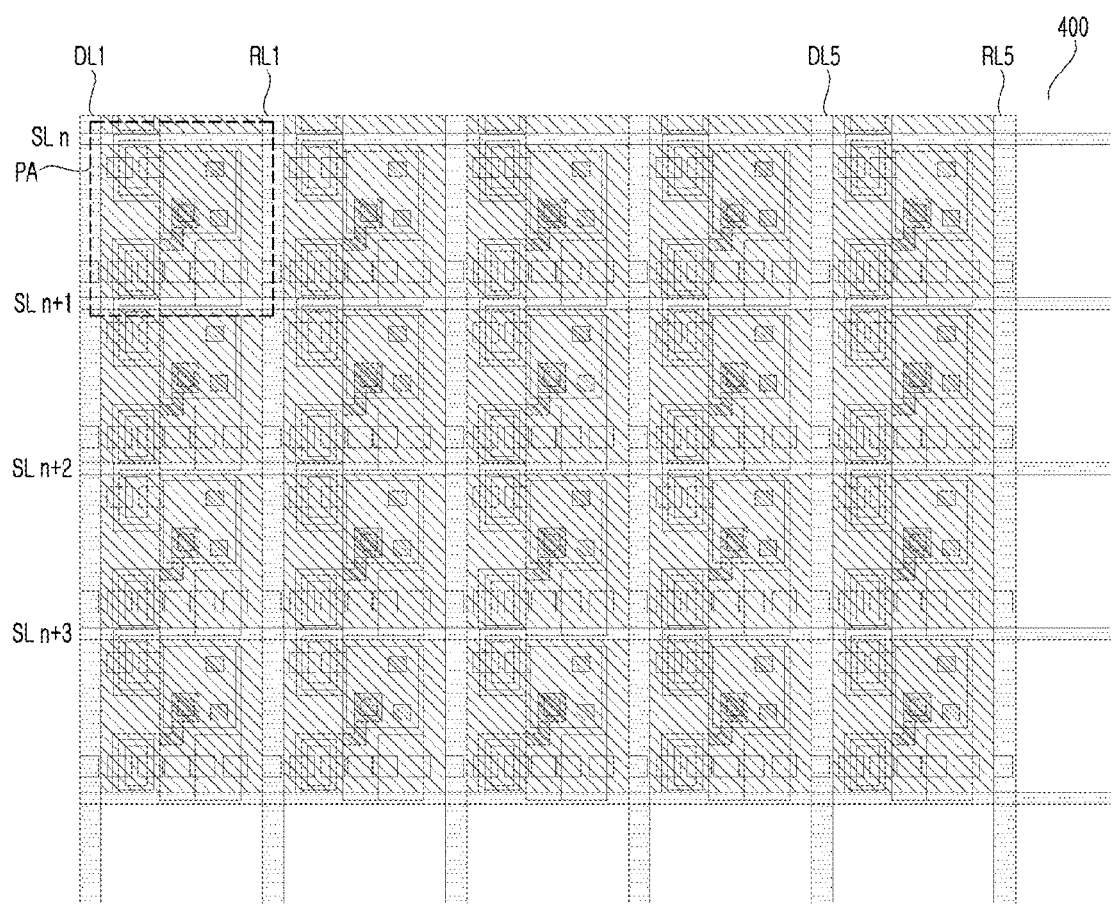
FIG. 12 is a plan view illustrating a sensor array layer where a plurality of contact sensors are arranged, according to an embodiment of the present invention.
Figure 13:
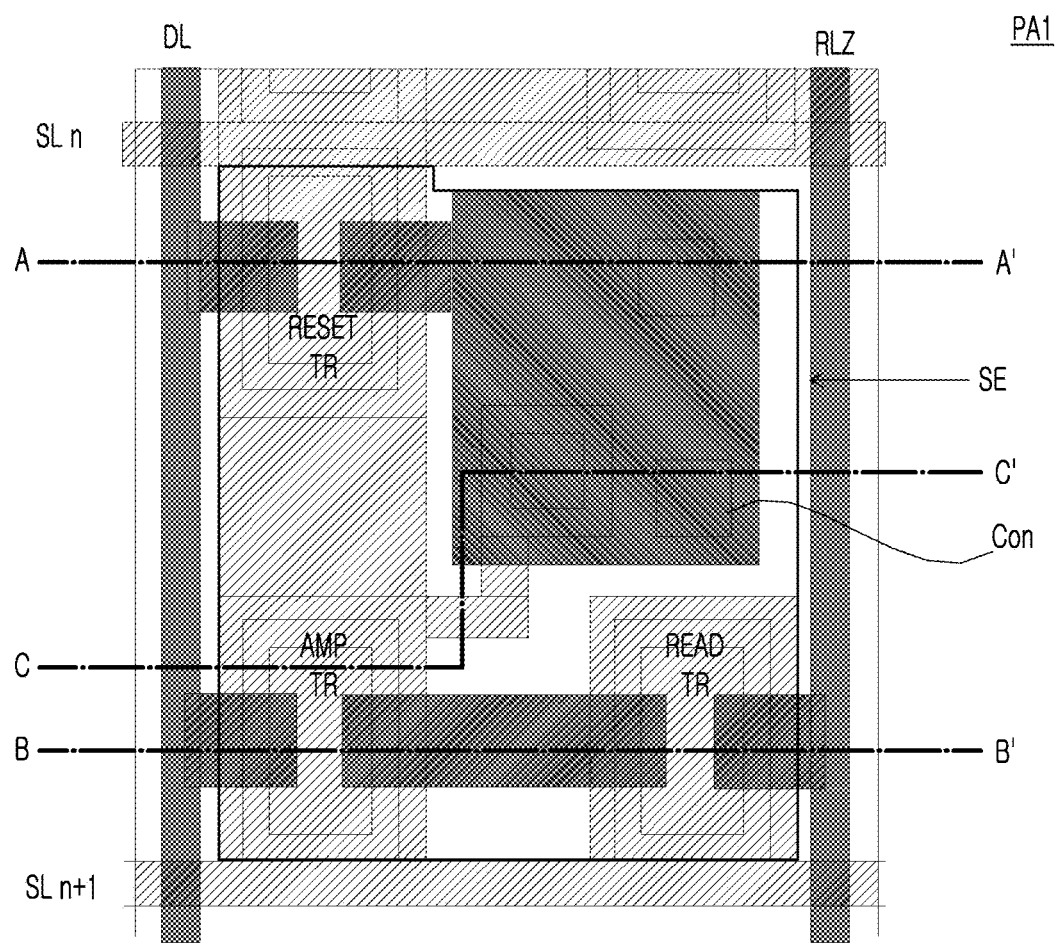
FIG. 13 is an enlarged plan view illustrating the contact sensor of a unit pixel illustrated in FIG. 12.

FIG. 12 is a plan view illustrating a sensor array layer 400 where a plurality of contact sensors are arranged, according to an embodiment of the present invention. FIG. 13 is an enlarged plan view illustrating the contact sensor of a unit pixel illustrated in FIG. 12.

Referring to FIG. 12, the sensor array layer 400 may include a plurality of contact sensors PA. Each contact sensor PA is connected to one data line DL1, one readout line RL, and two scan lines SLn and SLn+1. For the sake of convenience in explanation, FIG. 12 illustrates that the sensor array layer 400 includes a group of contact sensors PA arranged in 5×4. However, the present invention is not limited thereto, and the sensor array layer 400 may be implemented as an array of M×N.

Specifically, referring to FIG. 13 illustrating an enlarged view of the unit contact sensor PA of FIG. 12, one unit contact sensor PA may be connected to the data line DL, the readout line RL, and the scan line SL, and include the reset transistor Reset TR, T1, the amplifying transistor Amp TR, T2, the detecting transistor Read TR, T3, and the pixel electrode SE.

In FIG. 13, no shield electrode overlapping each transistor T1 to T3 is present, and the whole surface of the unit contact sensor PA may overlap the pixel electrode SE. In this case, the pixel electrode SE may be connected to the drain electrode RD of the reset transistor T1 and the gate electrode AG of the amplifying transistor T2 through the contactor.

Figure 14:
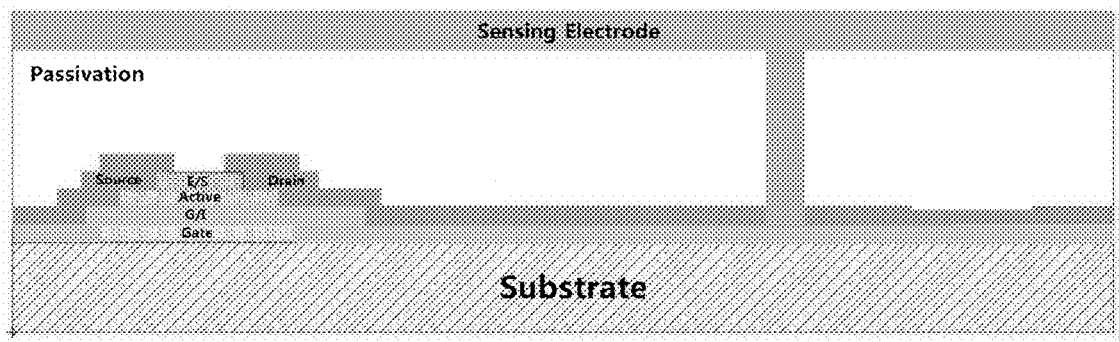
FIG. 14 is a side view illustrating the contact sensor of a unit pixel illustrated in FIG. 13 taken along the line A-A'.
Figure 15:
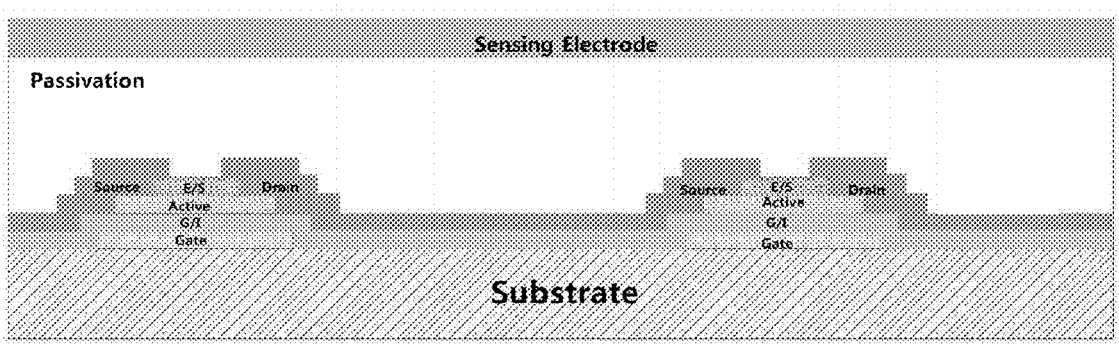
FIG. 15 is a side view illustrating the contact sensor of a unit pixel illustrated in FIG. 13 taken along the line B-B'.
Figure 16:
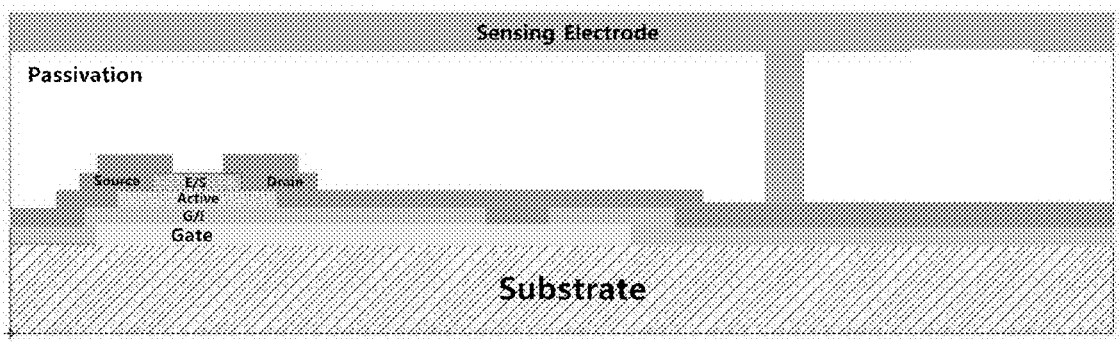
FIG. 16 is a side view illustrating the contact sensor of a unit pixel illustrated in FIG. 13 taken along the line C-C'.

FIG. 14, FIG. 15, and FIG. 16 are side views illustrating the contact sensors PA of a unit pixel illustrated in FIG. 13 taken along the lines A-A', B-B', and C-C', respectively.

Referring to FIGS. 14, 15, and 16, each transistor T1 to T3 forms a gate and a gate insulating layer in the substrate. An active layer is formed in the gate insulating layer, and then the patterning is performed through photolithography, to form a source/drain electrode.

Referring to FIG. 14, when viewing the contact sensor from the cross section taken along the line A-A', the reset transistor T1 positioned at the bottom left side may include the source/drain electrode, the gate electrode, the gate insulating layer G/I, and the active layer. Here, the substrate may be formed of a material such as glass, film, plastic PI, stainless steel, and the like.

The source/drain electrode or the gate electrode of the reset transistor T1 may be implemented with a single substance, such as ITO, IZO, Mo, Al, Cu, Ag, Ti, and the like, or a synthetic substance. The active area between the source/drain electrode may be implemented with a-Si:H, low temperature poly silicon (LTPS), oxide substance such as indium gallium zinc oxide (IGZO), organic substance, etc. The gate insulating layer G/I may be implemented with $SiO_2$, $SiN_X$, etc.

The reset transistor T1 may further include an edge stopper. The edge stopper E/S may be implemented with a substance such as $SiO_2$, $SiN_X$, etc. The edge stopper protects the active layer pre-formed by a chemical substance in a photolithography process for preparing the source-drain electrode, thereby preventing the active area from being damaged.

During a process for preparing the contact sensor PA, a passivation layer may be formed for making the surface uniform before the pixel electrode is formed in the reset transistor T1. The passivation layer may be implemented with a transparent substance, such as thin glass, $SiO_2$, $SiN_X$, etc.

As described above in connection with FIG. 13, the drain electrode RD of the reset transistor T1 is connected to the pixel electrode SE. The pixel electrode SE is formed to overlap the whole surface of the unit contact sensor, as illustrated in FIG. 12 and FIG. 13. Accordingly, the pixel electrode SE may be connected to the drain electrode RD of the reset transistor T1 through the contactor CON formed through an end of the passivation layer. The pixel electrode SE may be implemented with a single substance with light transmission, such as ITO, IZO, Mo, Al, Cu, Ag, Ti, etc., or a synthetic substance.

Referring to FIG. 15, the amplifying transistor T2 positioned at the bottom left side when viewing the contact sensor from the cross section taken along the line B-B', is formed in the substrate and may include the source/drain electrode, the gate electrode, the gate insulating layer G/I, and the active layer. The detecting transistor T3 at the bottom right side is also formed in the substrate and may include the source/drain electrode, the gate electrode, the gate insulating layer G/I, and the active layer. Here, the substrate may be formed of a material, such as glass, film, plastic PI, stainless steel, and the like.

The source/drain electrode, the gate electrode, the gate insulating layer G/I, and the active layer constituting the amplifying transistor T2 and the detecting transistor T3 are prepared together with a process of constituting the reset transistor. Accordingly, they may be formed of substances the same as those constituting the reset transistor T1.

The amplifying transistor T2 and the detecting transistor T3 may further include an edge stopper, as in the case of the reset transistor T1 described above in connection with FIG. 14. A passivation layer may be formed in the contact sensor PA.

During a process for preparing the contact sensor PA, the gate electrode AG of the amplifying transistor may be connected to the drain electrode RD of the reset transistor, and the pixel electrode overlapping the contact sensor may be connected to the gate electrode of the amplifying transistor, as illustrated in FIG. 13 and FIG. 16.

According to an embodiment of the present invention, when scanning the surface of the contact means with the contact sensor, a transparent electrode may be implemented with an enlarged size, thereby allowing for visibility and increasing image sensitivity of a display apparatus. Also, the magnitude of a signal to be detected can increase by using a coupling phenomenon occurring from parasitic capacitance included in transistors and peripheral circuit configurations.

Figure 17:
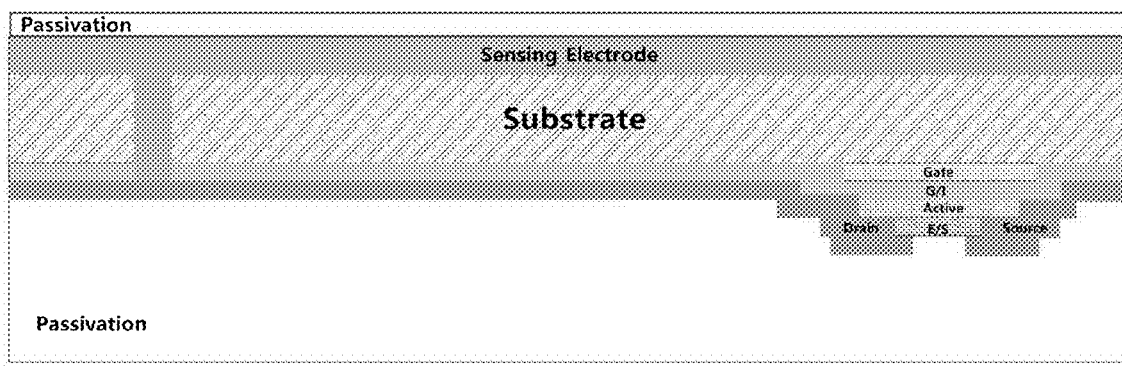
FIG. 17 is a side view illustrating a contact sensor according to an embodiment of the present invention.

FIG. 17 is a side view illustrating a contact sensor according to an embodiment of the present invention. Hereinafter, for the sake of convenience in explanation, a difference from FIG. 14 is mainly described.

Referring to FIG. 17, in a process for preparing each transistor T1 to T3, the gate insulating layer is formed after the gate is formed in the substrate. The source/drain electrode may be patterned to be formed through photolithography after the active layer is formed in the gate insulating layer. Here, in order to protect the active layer, an edge stopper area may be further formed before the source/drain electrode is patterned.

Unlike FIG. 14, the pixel electrode may be formed opposite the substrate where the transistors are formed. Here, the pixel electrode may be connected to the drain electrode of the reset transistor T1 and the gate electrode of the amplifying transistor T2 by a via formed through an end of the substrate. Also, the contact sensor may further include a passivation layer, a protective layer, in the pixel electrode, to prevent the pixel electrode from being damaged by contact of the contact means. The passivation layer may include a transparent material, such as thin glass, ultra-thin glass, $SiO_2$, $SiN_x$, etc.

Figure 18:
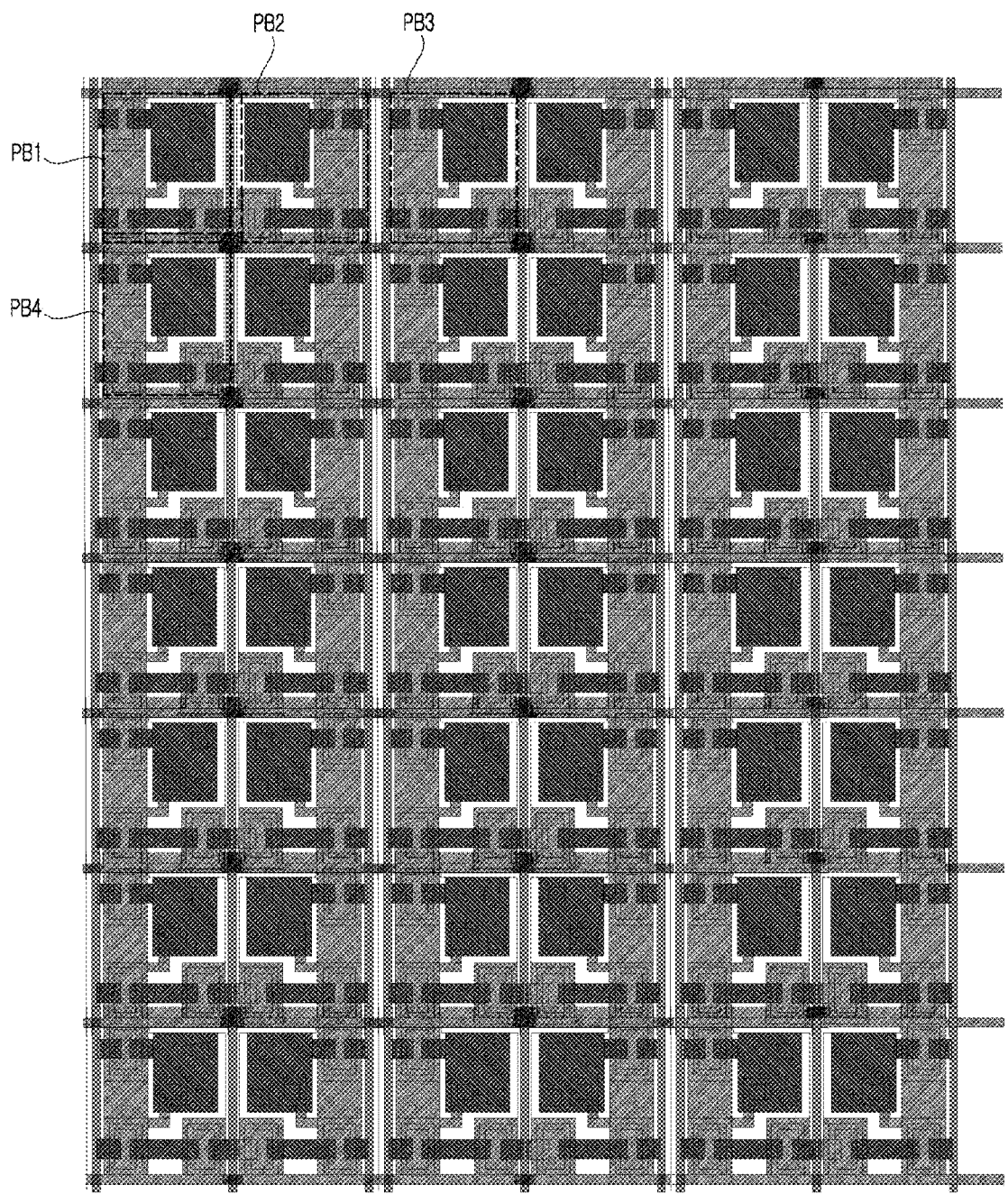
FIG. 18 is a plan view illustrating a sensor array layer where a plurality of contact sensors are arranged, according to an embodiment of the present invention.
Figure 19:
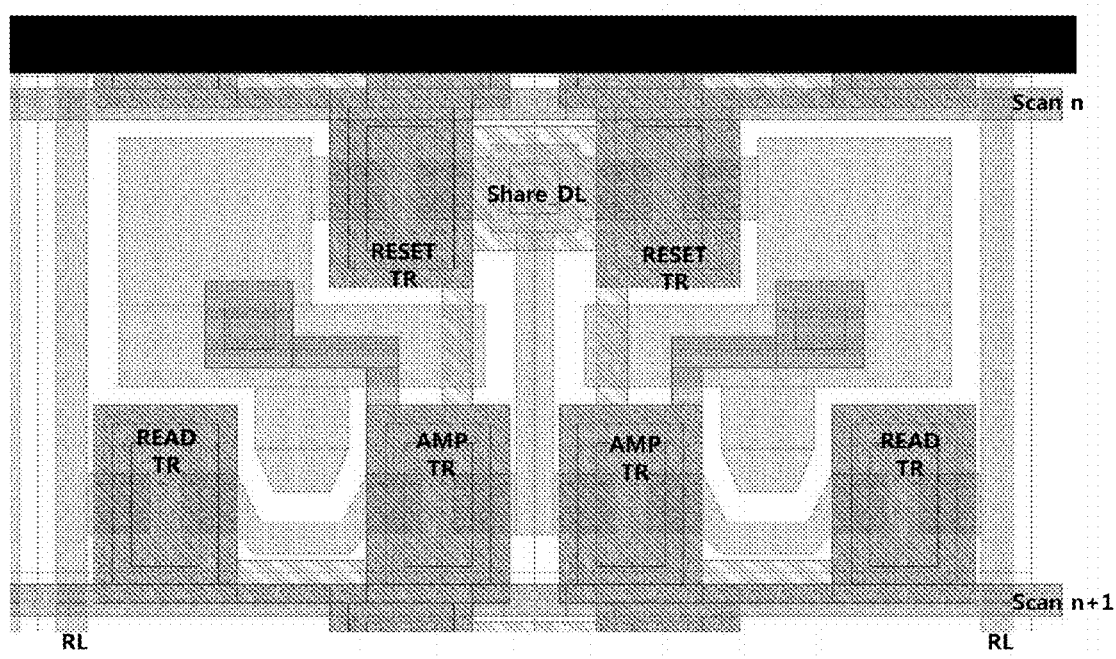
FIG. 19 is an enlarged plan view illustrating the contact sensor of a unit pixel illustrated in FIG. 18.

FIG. 18 is a plan view illustrating a sensor array layer where a plurality of contact sensors are arranged, according to an embodiment of the present invention. FIG. 19 is an enlarged plan view illustrating the contact sensor of a unit pixel illustrated in FIG. 18.

Referring to FIG. 18, the sensor array layer may include a plurality of contact sensors PB. Unlike the embodiment described above in connection with FIG. 12, the contact sensors PB may be symmetrical to other unidirectional contact sensors.

Specifically, the first contact sensor PB1 to the third contact sensor PB3 may be unidirectionally arranged, for example, in parallel in a line direction. The first contact sensor PB1 may be symmetrical to the second contact sensor PB with respect to the readout line RL or the data line DL. In such a manner, the second contact sensor PB2 and the third contact sensor PB3 may be symmetrical to each other with respect to the side at which the two sensors meet.

Meanwhile, the first contact sensor PB1 to the third contact sensor PB3 may not be symmetric to adjacent contact sensors in a column direction, a different direction from the direction in which the contact sensors are arranged. Referring to FIG. 18, the first contact sensor PB1 may not be symmetrical to the fourth contact sensor PB4 with respect to the scan line, the side at which the contact sensors meet.

Referring to FIG. 19, a pair of contact sensors unidirectionally arranged may be symmetrical to each other with respect to the data line DL. For example, the reset transistor, the amplifying transistor, the detecting transistor, the pixel electrode, and the signal lines DL, RL, SL may be symmetrical to each other with respect to the readout line RL or the data line DL.

When adjacent contact sensors are arranged to be symmetrical to each other, separate data lines may be arranged for each contact sensor. However, according to an embodiment, the symmetry reference line may be shared by two adjacent contact sensors. According to such a configuration, the number of signal wirings decreases, the aperture ratio of the contact sensor to the display unit pixel increases, thereby improving visibility of the display.

Figure 20:
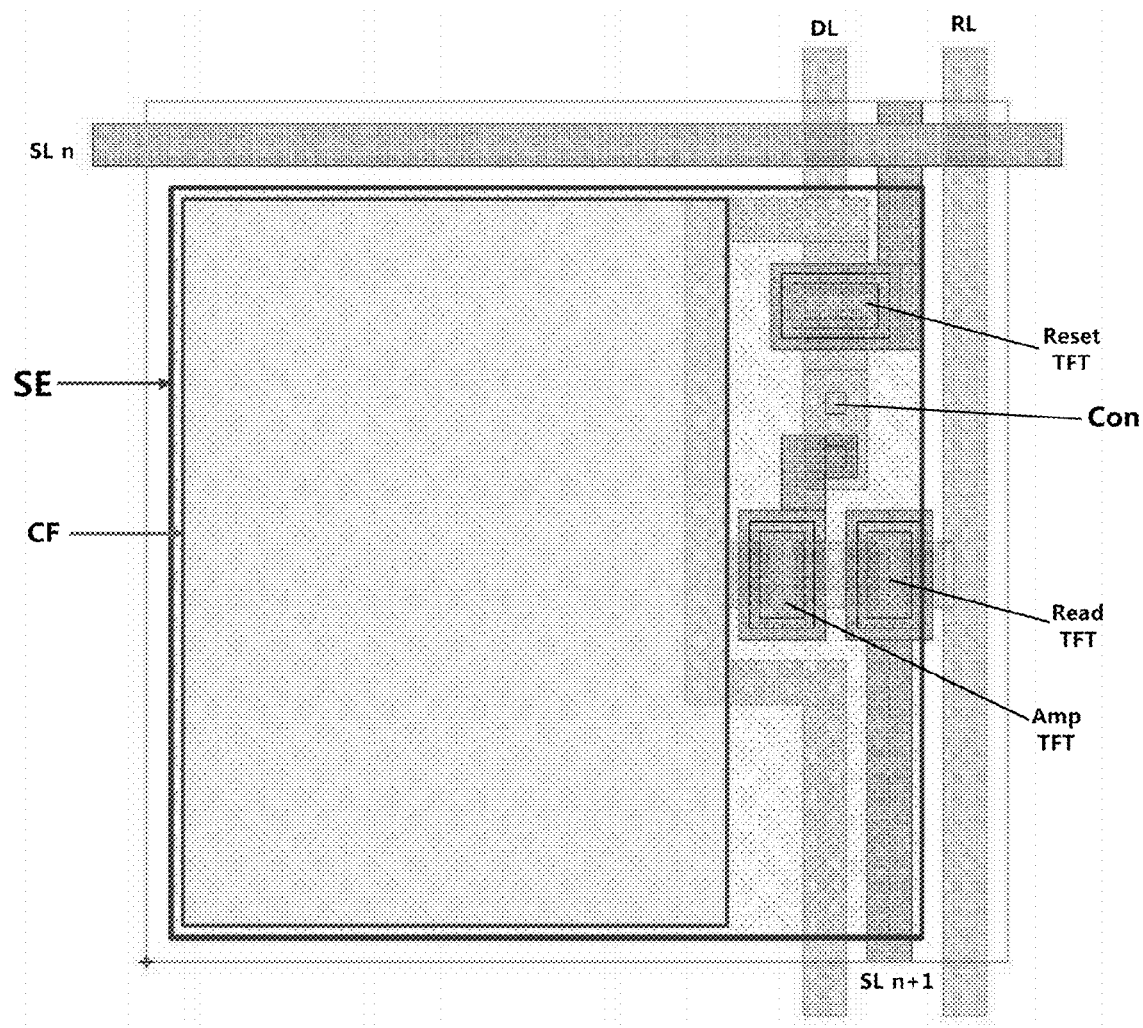
FIG. 20 is a plan view illustrating a contact sensor according to an embodiment of the present invention.

FIG. 20 is a plan view illustrating a contact sensor according to an embodiment of the present invention.

Referring to FIG. 20, the contact sensor may include the reset transistor, the amplifying transistor, the detecting transistor, the pixel electrode SE, and the signal lines DL, RL, SL.

The pixel electrode SE may be positioned on a different plane from the transistors and connected to the drain electrode of the reset transistor and the gate electrode of the amplifying transistor through the contactor CON. The pixel electrode is independent from adjacent contact sensors, and may be formed with an area enough to cover all the sizes of unit contact sensors. Here, the pixel electrode may be implemented with a single substance with light transmission, such as ITO, IZO, Mo, Al, Cu, Ag, Ti, etc., or a synthetic substance.

As described above in connection with FIG. 11 or below, when the source electrodes, the drain electrodes, or the gate electrodes of the reset transistor T1, the amplifying transistor T2, the detecting transistor T3 are translucent or opaque, and when the contact sensor overlaps the display unit pixel, the aperture ratio of the display pixel decreases, and thus the display visibility may be lowered.

According to an embodiment of the present invention, even when the source electrodes, the drain electrodes, or the gate electrodes constituting at least one of the transistors are translucent or opaque, the transistors T1 to T3 may be arranged in a black matrix where no color pixel CF is arranged in the display pixel in the contact sensor.

The black matrix is an area where driving elements for implementing the display are arranged to block light transmission. Accordingly, when the transistors and the signal wirings of the contact sensor are formed in the black matrix, the display visibility may not be lowered.

Although the exemplary embodiments of the present disclosure have been disclosed for illustrative purposes, those skilled in the art will appreciate that various modifications, additions and substitutions are possible, without departing from the scope and spirit of the present disclosure as disclosed in the accompanying claims. Therefore, it should be understood that the forgoing description is by way of example only, and is not intended to limit the present disclosure. For example, each constituent explained in singular form may be carried out being dispersed, and likewise, constituents explained as being dispersed may be carried out in combined forms.

The scope of the present disclosure is defined by the foregoing claims, and it is intended that the present disclosure covers the modifications or variations of the present disclosure provided they come within the scope of the appended claims and their equivalents.

EXPLANATION OF REFERENCE NUMERAL

210: First substrate
220: Thin film transistor layer
230: Liquid crystal layer
240: Color filter layer
250: Second substrate
260: Cover window
270: Protective layer
300: Sensor array layer
SN: Contact sensor
SL: Scan line
RL: Readout line
Vdd: Power input terminal
T1: Reset transistor
T2: Amplifying transistor
T3: Detecting transistor
Con: Contactor
SE: Pixel electrode

What is claimed is:

1. A display apparatus capable of image scanning, the apparatus comprising a contact sensor, wherein the contact sensor comprises:
   a pixel electrode forming a contact capacitance by contact with a contact means;
   a reset transistor including a first electrode connected to a node where the contact capacitance is formed, and a second electrode connected to a terminal supplying a signal to the node;
   an amplifying transistor including a third electrode connected to the node, and a fourth electrode connected to the terminal; and
   a detecting transistor including a fifth electrode connected to the amplifying transistor, and a sixth electrode connected to a readout line detecting a current corresponding to the contact capacitance;

wherein a passivation layer is formed between the pixel electrode, and the reset transistor, the amplifying transistor and the detecting transistor, and wherein the pixel electrode is connected to the first electrode of the reset transistor or the third electrode of the amplifying transistor through a contactor formed through an end of the passivation layer.

2. The display apparatus of claim 1, wherein the reset transistor, the amplifying transistor, and the detecting transistor are arranged so as not to overlap color pixels in a color filter layer, and wherein the pixel electrode is arranged to overlap at least a part of the color pixels.

3. The display apparatus of claim 1, wherein the amplifying transistor generates a current varying depending on a voltage charged in the contact capacitance and delivers the generated current to the detecting transistor.

4. The display apparatus of claim 1, wherein the detecting transistor further includes a seventh electrode connected to a scan line supplying a selective signal, and the detecting transistor is turned on by the selective signal from the scan line and delivers to the readout line the current generated by the amplifying transistor.

5. The display apparatus of claim 1, wherein the reset transistor, the amplifying transistor, and the detecting transistor are formed of a transparent thin film transistor and overlap at least a part of color pixels.

6. The display apparatus of claim 1, wherein the pixel electrode is arranged opposite to a substrate in which the reset transistor, the amplifying transistor, and the detecting transistor are arranged, and wherein the pixel electrode is connected to the first electrode of the reset transistor or the third electrode of the amplifying transistor through a via formed through an end of the substrate.

7. The display apparatus of claim 1, wherein the terminal is connected to a power input terminal.

8. The display apparatus of claim 1, wherein at least a part of the reset transistor, the amplifying transistor, the detecting transistor, the pixel electrode, and the signal line constituting each contact sensor of a pair of contact sensors unidirectionally arranged are symmetrical with respect to a data line or the readout line arranged between the pair of contact sensors.

9. The display apparatus of claim 1, wherein the terminal is connected to the scan line supplying a selective signal.

10. The display apparatus of claim 9, wherein at least a part of the reset transistor, the amplifying transistor, the detecting transistor, the pixel electrode, and the signal line constituting each contact sensor of a pair of contact sensors unidirectionally arranged are symmetrical with respect to the readout line arranged between the pair of contact sensors.

* * * * *